(12) United States Patent
Lee et al.

(10) Patent No.: US 12,376,478 B2
(45) Date of Patent: Jul. 29, 2025

(54) DISPLAY DEVICE AND MANUFACTURING METHOD THEREOF

(71) Applicant: Samsung Display Co., LTD., Yongin-si (KR)

(72) Inventors: Jin-Suk Lee, Gwangmyeong-si (KR); Kohei Ebisuno, Hwaseong-si (KR); Jong Min Lee, Suwon-si (KR); Yong Ho Yang, Suwon-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 737 days.

(21) Appl. No.: 17/523,314

(22) Filed: Nov. 10, 2021

(65) Prior Publication Data
US 2022/0320199 A1    Oct. 6, 2022

(30) Foreign Application Priority Data

Apr. 2, 2021  (KR) .......................... 10-2021-0043284

(51) Int. Cl.
*H10K 59/88*  (2023.01)
*H10K 59/124*  (2023.01)
(Continued)

(52) U.S. Cl.
CPC ........... *H10K 59/88* (2023.02); *H10K 59/124* (2023.02); *H10K 59/131* (2023.02); *H10K 59/65* (2023.02);
(Continued)

(58) Field of Classification Search
CPC ..... H10K 59/65; H10K 59/124; H10K 59/131; H10K 59/1201; H10K 59/80517;
(Continued)

(56) References Cited

U.S. PATENT DOCUMENTS

2017/0373128 A1* 12/2017 Lee ...................... H10K 59/124
2019/0115403 A1*  4/2019 Kang ................ H01L 29/78633
(Continued)

FOREIGN PATENT DOCUMENTS

KR    10-2017-0115177      10/2017
KR    10-2020-0102580       9/2020
(Continued)

*Primary Examiner* — Sitaramarao S Yechuri
(74) *Attorney, Agent, or Firm* — KILE PARK REED & HOUTTEMAN PLLC

(57) ABSTRACT

A display device includes a substrate including an opening area, a peripheral area adjacent to the opening area, and a display area adjacent to the peripheral area; a semiconductor layer overlapping the display area, disposed on the substrate, and including a channel; a gate electrode overlapping the channel of the semiconductor layer; an insulating layer disposed on the gate electrode, and including a first inorganic insulating layer and a second inorganic insulating layer disposed on the first inorganic insulating layer; a first electrode disposed on the insulating layer; an emission layer disposed on the first electrode; and a second electrode disposed on the emission layer, wherein the second inorganic insulating layer is not disposed in at least a portion of an open region in which the emission layer and the second electrode are disconnected in the peripheral area.

14 Claims, 22 Drawing Sheets

(51) Int. Cl.
*H10K 59/131* (2023.01)
*H10K 59/65* (2023.01)
*H10K 59/12* (2023.01)
*H10K 59/80* (2023.01)

(52) U.S. Cl.
CPC ... *H10K 59/1201* (2023.02); *H10K 59/80517* (2023.02); *H10K 59/80518* (2023.02); *H10K 59/8731* (2023.02)

(58) Field of Classification Search
CPC ......... H10K 59/80518; H10K 59/8731; H10K 59/88; H10K 59/1213; H10K 59/123; H10K 59/00; H10K 50/84; H01L 27/1248; H01L 27/1259; H10D 86/021; H10D 86/451
See application file for complete search history.

(56) References Cited

U.S. PATENT DOCUMENTS

| | | | |
|---|---|---|---|
| 2019/0157352 A1* | 5/2019 | Li | C07F 7/24 |
| 2019/0252478 A1* | 8/2019 | Son | H01L 27/124 |
| 2020/0328375 A1 | 10/2020 | Won | |
| 2021/0066418 A1 | 3/2021 | Seo et al. | |
| 2021/0143365 A1* | 5/2021 | Jo | H10K 59/122 |
| 2021/0320158 A1* | 10/2021 | Hanada | G02F 1/13338 |
| 2021/0408200 A1* | 12/2021 | Zhao | H10K 59/121 |
| 2022/0149323 A1 | 5/2022 | Kim et al. | |
| 2023/0189570 A1* | 6/2023 | Lin | H10K 59/80521 257/40 |

FOREIGN PATENT DOCUMENTS

| | | |
|---|---|---|
| KR | 10-2020-0110575 | 9/2020 |
| KR | 10-2022-0065122 | 5/2022 |

\* cited by examiner

DISPLAY DEVICE AND MANUFACTURING METHOD THEREOF

CROSS-REFERENCE TO RELATED APPLICATION(S)

This application claims priority to and the benefit of Korean Patent Application No. 10-2021-0043284 under 35 U.S.C. § 119, filed in the Korean Intellectual Property Office (KIPO) on Apr. 2, 2021, the entire contents of which are incorporated herein by reference.

BACKGROUND

1. Technical Field

The disclosure relates to a display device and a manufacturing method thereof, and in particular, it relates to a display device having an opening area of which at least a region thereof is formed with an opening, and a manufacturing method thereof.

2. Description of the Related Art

Recently, various types of portable electronic devices include camera functions, so cases in which users carry only the electronic device with a built-in camera function instead of carrying a camera are rapidly increasing.

Conventionally, a camera, a flash, a speaker, a photosensor, etc., are provided outside a display area of the electronic device, so a space for the electronic device to display images is reducing.

The above information disclosed in this Background section is only for enhancement of understanding of the background of the described technology, and therefore it may contain information that does not form the prior art that is already known in this country to a person of ordinary skill in the art.

SUMMARY

The described technology has been made in an effort to provide a display device including an opening area that includes an opening.

The described technology has been made in another effort to provide a display device in which a camera is positioned for photographing pictures or videos through an opening area and a manufacturing method thereof. The described technology has been made in another effort to provide a display device for displaying images in a relatively wide region by positioning an opening area and a camera in a display area, and a manufacturing method thereof.

An embodiment provides a display device including a substrate including an opening area, a peripheral area adjacent to the opening area, and a display area adjacent to the peripheral area; a semiconductor layer overlapping the display area, disposed on the substrate, and including a channel; a gate electrode overlapping the channel of the semiconductor layer; an insulating layer disposed on the gate electrode, and including a first inorganic insulating layer and a second inorganic insulating layer disposed on the first inorganic insulating layer; a first electrode disposed on the insulating layer; an emission layer disposed on the first electrode; and a second electrode disposed on the emission layer. The second inorganic insulating layer may not be disposed in at least a portion of an open region in which the emission layer and the second electrode are disconnected in the peripheral area.

An end of the second inorganic insulating layer may correspond to an end of the emission layer or an end of the second electrode in a cross-sectional view, and the first inorganic insulating layer may include a silicon oxide, while the second inorganic insulating layer may include a silicon nitride.

The first inorganic insulating layer may be continuously disposed in the open region.

The peripheral area may include a first peripheral area including the open region, and a second peripheral area including a roundabout portion, and a data line may be disposed on the insulating layer and detour around the roundabout portion.

The opening area that penetrates through the display panel may be disposed in the first peripheral area, and the display device may further include a camera disposed in the opening area.

The first peripheral area may include at least one dam, and the dam may have a ring shape.

The open region may be disposed on sides of the dam.

Another embodiment provides a display device including a substrate including an opening area, a peripheral area adjacent to the opening area, and a display area adjacent to the peripheral area; a semiconductor layer overlapping the display area, disposed on the substrate, and including a channel; a gate electrode overlapping the channel of the semiconductor layer; an insulating layer disposed on the gate electrode, and including a first inorganic insulating layer and a second inorganic insulating layer disposed on the first inorganic insulating layer; a first electrode disposed on the insulating layer; an emission layer disposed on the first electrode; and a second electrode disposed on the emission layer. The second inorganic insulating layer may not be disposed in at least a portion of an open region in which the emission layer and the second electrode are disconnected in the peripheral area, and a thickness difference between the open region and the peripheral area adjacent to the display area is about 300 nm to about 500 nm.

The first inorganic insulating layer may include a silicon oxide, and the second inorganic insulating layer may include a silicon nitride.

The first inorganic insulating layer may be continuously disposed in the open region.

A thickness of the second inorganic insulating layer may be about 20 nm to about 100 nm.

The opening area penetrating through the display panel may be disposed in the peripheral area, and the display device may further include a camera disposed in the opening area.

The peripheral area may include a first peripheral area including the open region, a second peripheral area including a roundabout portion, and a data line may be disposed on the insulating layer and detour around the roundabout portion.

The first peripheral area may include at least one dam, the dam may have a ring shape, and the open region may be disposed on sides of the dam.

Yet another embodiment provides a method for manufacturing a display device, including forming an opening area, a peripheral area adjacent to the opening area, and a display area adjacent to the peripheral area. The forming of the peripheral area may include forming an insulating layer on a substrate; forming a first data conductive layer including a first layer on the insulating layer, a second layer disposed on the first layer, and a third layer disposed on the second layer; stacking a material for a second data conductive layer on the first data conductive layer; removing the material for a second data conductive layer, and removing all of the third layer of the first data conductive layer, part of the second layer of the first data conductive layer, and part of the insulating layer; stacking a material for a first electrode; removing the material for a first electrode, and removing all of the remaining second layer to form a sacrificial layer; stacking a functional layer and a second electrode on the sacrificial layer; removing the sacrificial layer, and the functional layer and the second electrode provided adjacent to the sacrificial layer, by irradiating laser beams to the sacrificial layer; and forming the opening area penetrating through a display panel, wherein the first electrode, the functional layer, and the second electrode form a light-emitting device.

The removing of the material for a second data conductive layer may use a wet etching method.

The first layer and the third layer of the first data conductive layer may include titanium, and the second layer may include aluminum.

The sacrificial layer may include aluminum.

The material for a second data conductive layer may have a triple-layer structure including a first layer, a second layer disposed on the first layer, and a third layer disposed on the second layer, and the first layer and the third layer of the material for a second data conductive layer may include titanium, while the second layer includes aluminum.

The material for a first electrode may have a triple-layer structure including a first layer, a second layer disposed on the first layer, and a third layer disposed on the second layer, and the first layer and the third layer of the material for a first electrode may include an indium tin oxide, while the second layer may include silver.

According to the embodiments, the peripheral area in which no image is displayed may be reduced and a wide display area for displaying images may be acquired by positioning the opening area corresponding to the camera in the display area.

BRIEF DESCRIPTION OF THE DRAWINGS

An additional appreciation according to the embodiments of the disclosure will become more apparent by describing in detail the embodiments thereof with reference to the accompanying drawings, wherein.

DETAILED DESCRIPTION OF THE EMBODIMENTS

Figure 1:
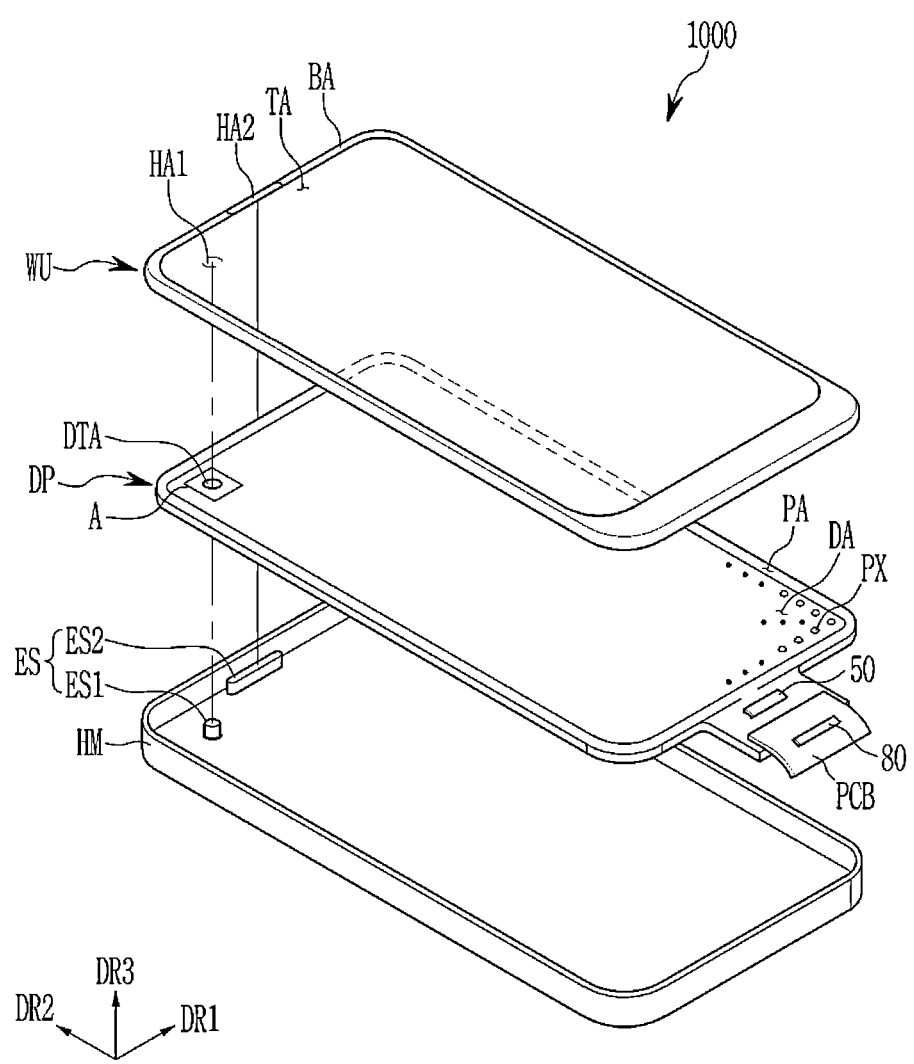
FIG. 1 illustrates a schematic exploded perspective view of a display device according to an embodiment.

The disclosure will be described more fully hereinafter with reference to the accompanying drawings, in which embodiments of the disclosure are shown. As those skilled in the art would realize, the described embodiments may be modified in various different ways, all without departing from the spirit or scope of the disclosure.

Parts that are irrelevant to the description will be omitted to clearly describe the disclosure, and the same elements will be designated by the same reference numerals throughout the specification.

The size and thickness of each configuration shown in the drawings are arbitrarily shown for better understanding and ease of description, but the disclosure is not limited thereto. In the drawings, the thickness of layers, films, panels, regions, etc., may be exaggerated for clarity. For ease of description, the thicknesses of some layers and areas may be exaggerated.

It will be understood that when an element such as a layer, film, region, or substrate is referred to as being "on" another element, it can be directly on the other element or intervening elements may also be present. In contrast, when an element is referred to as being "directly on" another element, there are no intervening elements present. Further, in the specification, the word "on" or "above" means disposed on or below the object portion, and does not necessarily mean disposed on the upper side of the object portion based on a gravitational direction.

Unless explicitly described to the contrary, the word "comprise" and variations such as "comprises" or "comprising" will be understood to imply the inclusion of stated elements but not the exclusion of any other elements.

Further, throughout the specification, the phrase "in a plan view" means viewing a target portion from the top, and the phrase "in a cross-sectional view" means viewing a cross-section formed by vertically cutting a target portion from the side.

The terms "about" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" may mean within one or more standard deviations, or within ±30%, 20%, 10%, 5% of the stated value.

It will be understood that the terms "contact," "connected to," and "coupled to" may include a physical and/or electrical contact, connection, or coupling.

The phrase "at least one of" is intended to include the meaning of "at least one selected from the group of" for the purpose of its meaning and interpretation. For example, "at least one of A and B" may be understood to mean "A, B, or A and B."

Unless otherwise defined or implied herein, all terms (including technical and scientific terms) used herein have the same meaning as commonly understood by those skilled in the art to which this disclosure pertains. It will be further understood that terms, such as those defined in commonly used dictionaries, should be interpreted as having a meaning that is consistent with their meaning in the context of the relevant art and the disclosure, and should not be interpreted in an ideal or excessively formal sense unless clearly so defined herein.

A display device according to an embodiment will now be described with reference to FIGS. 1 and 2.

Figure 2:
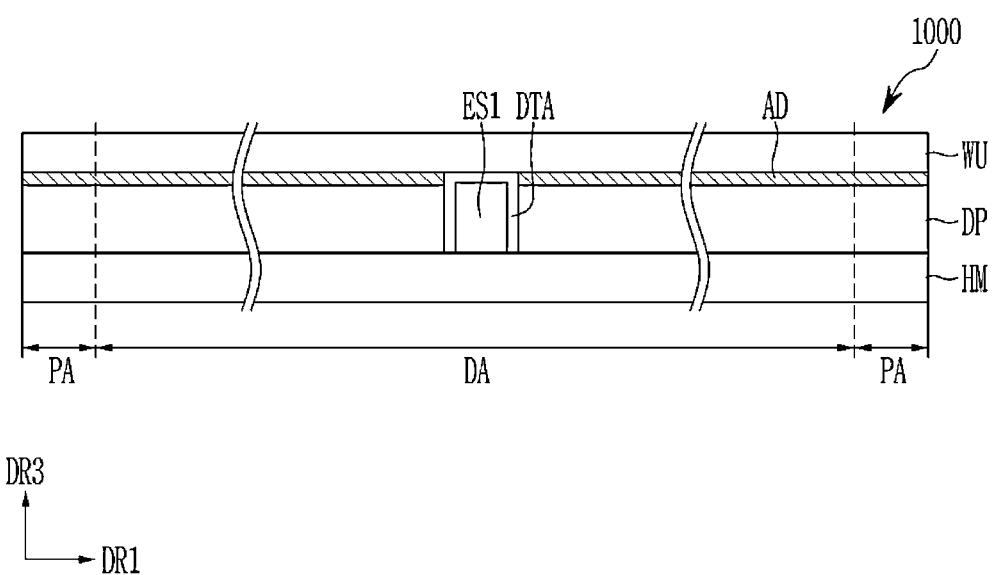
FIG. 2 illustrates a schematic cross-sectional view of a display device according to an embodiment.

FIG. 1 illustrates a schematic exploded perspective view of a display device according to an embodiment, and FIG. 2 illustrates a schematic cross-sectional view of a display device according to an embodiment.

Referring to FIGS. 1 and 2, a display device 1000 displays images in a third direction DR3 in a plane defined by a first direction DR1 and a second direction DR2. Front sides (or upper sides) and rear sides or lower sides of respective members are distinguished in the third direction DR3. Directions indicated by the first to third directions DR1 to DR3 are relative concepts, and they may be changed to other directions.

The display device 1000 includes a cover window WU, a display panel DP, and a housing member HM. In the embodiment, the display device 1000 may be configured by combining the cover window WU, the display panel DP, and the housing member HM. The display device 1000 may include an electronic module ES such as a camera or a sensor.

The cover window WU is disposed on the display panel DP to protect a front side of the display panel DP. The cover window WU may include a transmission area TA and a blocking area BA. The transmission area TA may be optically transparent and may transmit incident light. The blocking area BA may have relatively lower light transmittance than the transmission area TA. The blocking area BA may define a shape of the transmission area TA, and the blocking area BA may surround the transmission area TA. The blocking area BA may display a predetermined color. The blocking area BA may overlap a non-display area PA of the display panel DP to block the non-display area PA from being visible from the outside.

The cover window WU may include a first hole area HA1 and a second hole area HA2. The first hole area HA1 and the second hole area HA2 may respectively overlap the electronic module ES to be described below. The electronic module ES may photograph external objects or may sense or receive external light through the first hole area HA1 and the second hole area HA2.

According to an embodiment, the first hole area HA1 may be positioned in the transmission area TA, and the second hole area HA2 may be positioned in the blocking area BA. This is, however, only an illustration, and the first hole area HA1 and the second hole area HA2 may be positioned in regions that are opposite to each other, they may be positioned in the transmission area TA, or in the blocking area BA. The first hole area HA1 and the second hole area HA2 may have different forms. The first hole area HA1 may have a circular shape in a plan view, and the second hole area HA2 may have an oval shape with a major axis extending in the first direction DR1. The shapes of the first hole area HA1 and the second hole area HA2 are not limited thereto, and the sizes or shapes thereof are modifiable in many ways.

The display panel DP may be a flat rigid display panel or a flexible display panel. The display panel according to an embodiment is an emissive display panel. For example, the display panel may be an organic light emitting display panel or a quantum dot light emitting display panel. An intermediate layer of the organic light emitting display panel may include a functional layer and an emission layer, and the emission layer may include an organic light emitting material. An intermediate layer of the quantum dot light emitting display panel may include a quantum dot and a quantum rod. Depending on embodiments, the same may be an inorganic light emitting display pattern including an inorganic light emitting diode (LED). The display panel DP will be described hereinafter by using an organic light emitting display panel as an example.

The display panel DP displays images on the front side. The front side of the display panel DP includes a display area DA and a non-display area PA. The images are displayed in the display area DA. The non-display area PA may surround the display area DA.

The display panel DP may include pixels PX positioned in the display area DA. The pixels PX may emit light in response to electrical signals. The lights emitted by the pixels PX may together realize images. Each pixel PX includes a pixel circuit including transistors, and a light emitting diode LED for receiving a current from the pixel circuit and emitting light. The pixel circuit may further include a capacitor. A number of transistors, a number of capacitors, and a connection relationship thereof included in a pixel PX are modifiable in various ways.

The display panel DP according to an embodiment may include an opening area (or open area) DTA penetrating through the display panel DP. The display panel DP is not formed in the opening area DTA. Referring to FIG. 2, a first electronic module ES1 that is one of electronic modules (ES) may be positioned in the opening area DTA. The first electronic module ES1 may be a camera for photographing or capturing pictures or videos. The opening area DTA may overlap the first hole area HA1 of the cover window WU. The opening area DTA is positioned in the display area DA and is surrounded by the display area DA in a plan view. Some of the pixels PX may be disposed to surround the opening area DTA. Therefore, the image may be displayed in a region provided near the opening area DTA. Referring to an embodiment of FIG. 1, when the display area DA is seen from the front side, the opening area DTA is positioned on a top left side thereof. However, the opening area DTA may be positioned on a top right side thereof, or it may be disposed in a center of the display area DA, for example, on a position that has the same distance to a left end and a right end of the display area DA from the opening area DTA. The position of the opening area DTA is variable in the display area DA depending on embodiments. Region A in which the opening area DTA is positioned will be described below in detail with reference to FIG. 4.

The display panel DP includes a non-display area PA which extends from the display area DA and in which signal lines and a pad are positioned. A data driver 50 may be positioned in the non-display area PA. According to an embodiment, the pad of the non-display area PA may be electrically connected to a printed circuit board PCB including a driving chip 80, which will hereinafter be described in detail with reference to FIG. 3.

As shown in FIG. 2, an adhesive layer AD for combining the display panel DP to the cover window WU may be positioned between the display panel DP and the cover window WU. The adhesive layer AD may not be positioned in the opening area DTA in which the display panel DP is not formed. In case that light is input to the first electronic module ES1 such as a camera, the adhesive layer AD may cause an optical loss, so the adhesive layer AD may be omitted from a portion corresponding to the opening area DTA.

The display panel DP may further include a touch sensor for sensing a touch of a user. The touch sensor may be positioned on a front side of the pixel PX and may include at least one touch electrode. Various methods are applicable to the touch sensor that may be included in the embodiment, for example, a resistive type or a capacitive type. A capacitive type touch sensor may sense a touch by use of a touch electrode (for example, by a self-cap method), or may sense a touch by use of a pair of touch electrodes (for example, by a mutual cap method).

The electronic module ES includes various functional modules for operating the display device 1000. The electronic module ES may be electrically connected to the display panel DP through a connector (not shown). For example, the electronic module ES may be a camera, a speaker, or a light or heat sensor.

The electronic module ES may include a first electronic module ES1 and a second electronic module ES2.

The first electronic module ES1 may be a camera for photographing external objects received through the opening area DTA and/or the first hole area HA1. Information captured by the first electronic module ES1 may be stored in a storage unit (not shown). Depending on embodiments, the first electronic module ES1 may receive external inputs through the opening area DTA and the first hole area HA1 or may provide outputs through the opening area DTA and the first hole area HA1. Referring to FIG. 2, the first electronic module ES1 may be positioned in the opening area DTA penetrating through the display panel DP and may be disposed to photograph a front side of the display device 1000 through the cover window WU.

The second electronic module ES2 may include, for example, one or more of a light emitting module, a light sensing module, and a sound output module. The second electronic module ES2 may include a light emitting module for outputting infrared rays and a CMOS sensor for sensing the infrared rays, or it may be a receiver for providing a voice of a called party. Depending on embodiments, it may include an acoustic input module such as a microphone. This is, however, merely illustrative, and the electronic module ES may be configured with a single module, may include a greater number of electronic modules, may be arranged with various arrangement relationships, and is not limited to an embodiment.

The housing member HM is disposed on a lower side of the display panel DP. The housing member HM is combined to the cover window WU to configure an exterior of the display device 1000. The housing member HM may include a material with relatively high rigidity. For example, the housing member HM may include frames and/or plates made of glass, plastic, and metal. The housing member HM provides a predetermined receiving space. The display panel DP may be received in the receiving space and may be protected from external impacts.

A structure of the display panel DP including the opening area DTA will now be described with reference to FIG. 3.

Figure 3:
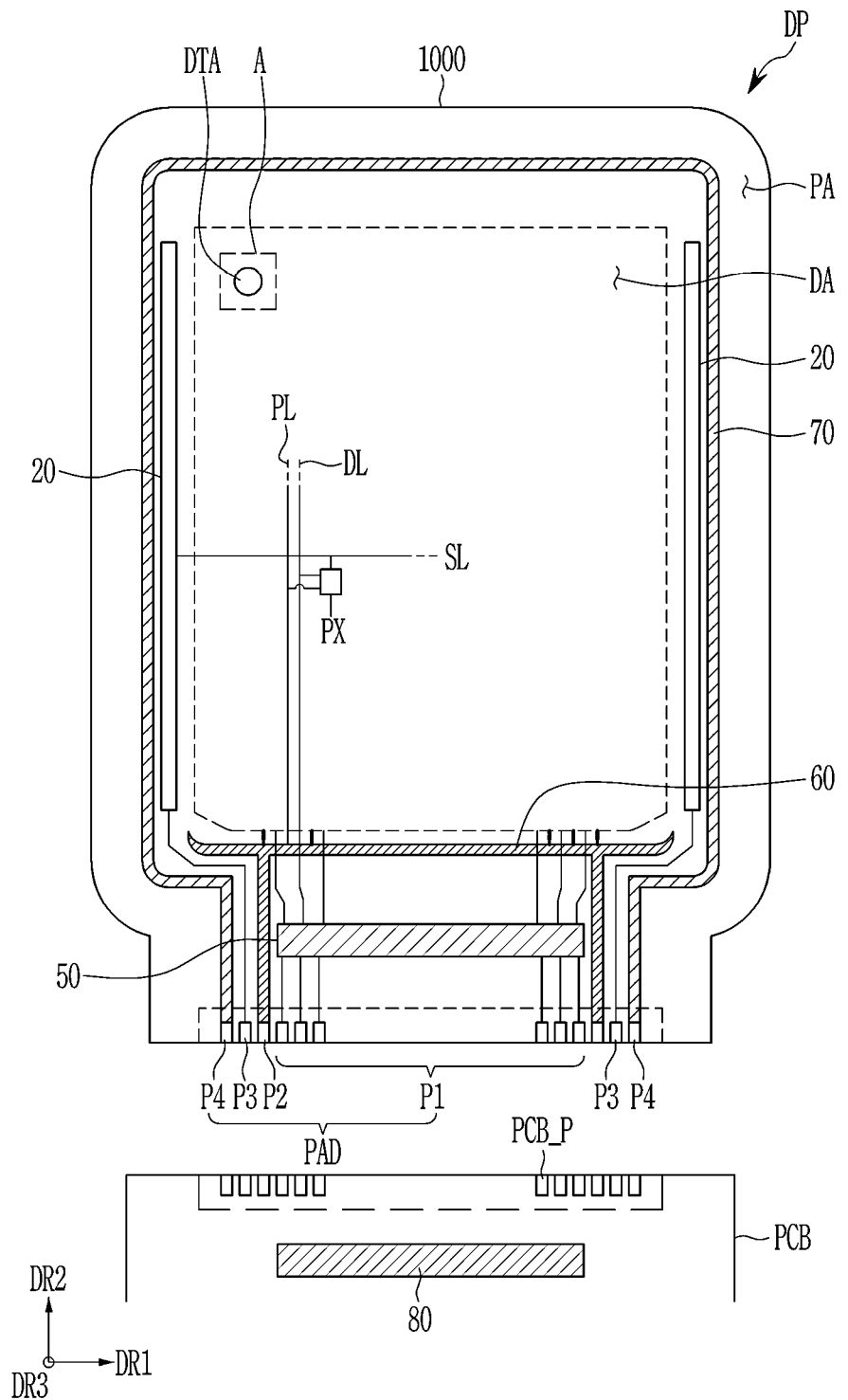
FIG. 3 illustrates a schematic plan view of constituent elements of a display panel according to an embodiment.

FIG. 3 illustrates a schematic plan view of constituent elements of a display panel according to an embodiment.

Referring to FIG. 3, the display panel DP may be divided into a display area DA and a non-display area PA, and the non-display area PA may be defined along an edge of the display area DA. The opening area DTA is positioned in the display area DA.

The display panel DP includes pixels PX. The pixels PX may be disposed in the display area DA. The pixels PX each include a light-emitting device and a pixel circuit electrically connected thereto. For example, each pixel PX emits red, green, blue, or white light, and it may include an organic light emitting diode.

The display panel DP may include signal lines and a pad PAD. The signal lines may include a scan line SL extending in the first direction DR1, and a data line DL and a driving voltage line PL extending in the second direction DR2.

Figure 4:
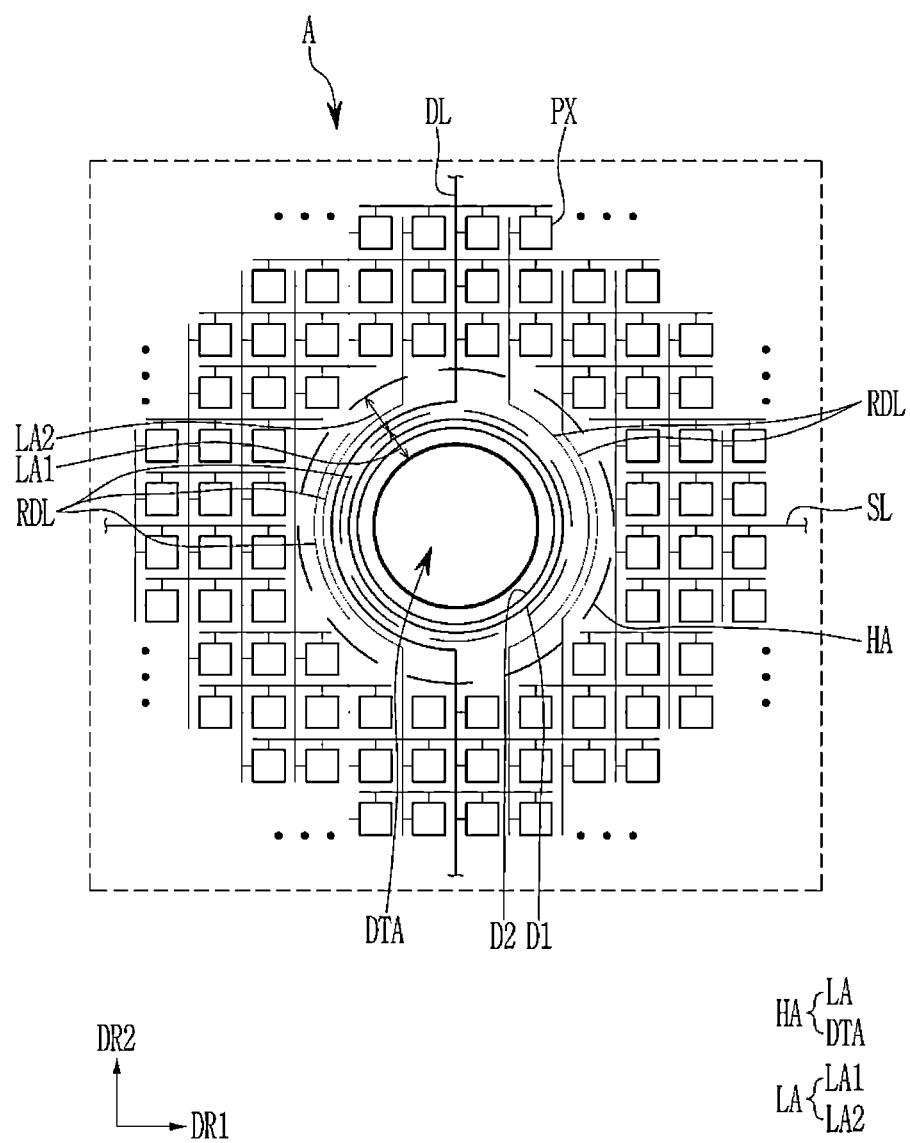
FIG. 4 illustrates a schematic plan view of an enlarged region A of FIG. 1 and FIG. 3.

The scan driver 20 is positioned on respective sides of the display area DA, and generates scan signals and transmits the scan signals to the respective pixels PX through the scan line SL. Referring to FIG. 4, the pixels PX other than pixels PX positioned on the right and left side of the opening area DTA in the first direction DR1 may receive scan signals from the two scan drivers 20 positioned on the right and left portion of the display area DA. The pixels PX positioned on the right and left portion of the opening area DTA may receive the scan signal from the scan driver 20 positioned on one of the two sides. A connection relationship between the pixel PX and the scan line SL will now be described in detail. The scan lines SL of the remaining pixels PX excluding the pixels PX positioned on the right and left portion of the opening area DTA may be electrically connected to the two scan drivers 20 positioned on the respective sides. On the contrary, the scan lines SL of the pixels PX positioned on the right and left portion of the opening area DTA are electrically connected to the scan driver 20 on one side. The right and left portion of the scan lines SL of the pixels PX positioned on the right and left portion of the opening area DTA are short-circuited with respect to the opening area DTA. For example, the scan line SL electrically connected to the pixel PX positioned on the left portion of the opening area DTA and the scan line SL electrically connected to the pixel PX positioned on the right portion of the opening area DTA are electrically disconnected from each other in the opening area DTA. As a result, the scan line SL of the pixel PX positioned on the left portion of the opening area DTA is electrically connected to the scan driver 20 positioned on the left portion of the display area DA, and the scan line SL of the pixel PX positioned on the right portion of the opening area DTA is electrically connected to the scan driver 20 positioned on the right portion of the display area DA.

The pad PAD is disposed at an end of the display panel DP and includes terminals P1, P2, P3, and P4. The pad PAD may not be covered (or overlapped) by an insulating layer but may be exposed and may be electrically connected to the printed circuit board PCB. The pad PAD may be electrically connected to a pad PCB_P of the printed circuit board PCB. The printed circuit board PCB may transmit a signal of the driving chip 80 or a power voltage to the pad PAD.

A controller changes image signals transmitted from an outside to image data signals, and transmits the changed signals to the data driver 50 through the terminal P1. The controller may receive a vertical synchronization signal, a horizontal synchronizing signal, and clock signals, may generate control signals for controlling driving of the scan driver 20 and the data driver 50, and may transmit the same thereto through the terminals P3 and P1. The controller transmits a driving voltage ELVDD to a driving voltage supply wire 60 through the terminal P2. The controller transmits a common voltage ELVSS to respective common voltage supply wires 70 through the terminal P4.

The data driver 50 is disposed in the non-display area PA, and it generates a data voltage DATA to be applied to the pixel PX, and transmits the same to the respective data lines DL. The data driver 50 may be disposed on a side of the display panel DP, for example, it may be disposed between the pad PAD and the display area DA. Referring to FIG. 4, the data line DL electrically connected to the remaining pixels PX excluding the pixels PX positioned on an upper side and a lower side of the opening area DTA in the second direction DR2 may extend in the second direction DR2 and may have a straight line structure. On the contrary, the data line DL electrically connected to the pixels PX positioned at a top and a bottom portion of the opening area DTA extends in the second direction DR2 and may include a portion (refer to RDL of FIG. 4) extending along a peripheral portion of the opening area DTA.

The driving voltage supply wire 60 is disposed in the non-display area PA. For example, the driving voltage supply wire 60 may be disposed between the data driver 50 and the display area DA. The driving voltage supply wire 60 provides the driving voltage ELVDD to the pixels PX. The driving voltage supply wire 60 is disposed in the first direction DR1 and may be electrically connected to driving voltage lines PL disposed in the second direction DR2.

The common voltage supply wire 70 is disposed in the non-display area PA. The common voltage supply wire 70 may surround the substrate SUB. The common voltage supply wire 70 transmits the common voltage ELVSS to an electrode e.g., a second electrode of the light-emitting device included in the pixel PX.

Region A including the opening area DTA shown in FIG. 3 will now be described with reference to FIG. 4.

FIG. 4 illustrates a schematic plan view of enlarged region A of FIGS. 1 and 3.

Referring to FIG. 4, the display panel DP includes signal lines SL and DL and pixels PX positioned on a substrate. The respective pixels PX may be electrically connected to the signal lines SL and DL. FIG. 4 illustrates that a pixel PX is electrically connected to a scan line SL, but the actual pixel PX may be electrically connected to scan lines SL.

A hole area HA included in the display panel DP includes an opening area DTA and a peripheral area LA surrounding the opening area DTA. The pixel PX is positioned outside the hole area HA and corresponds to the display area DA.

The peripheral area LA surrounds an external side of the opening area DTA and is a middle region between the display area DA and the opening area DTA. The peripheral area LA includes a first peripheral area LA1 and a second peripheral area LA2. Circles indicated in dashed lines in FIG. 4 represent borders for dividing the hole area HA and the first peripheral area LA1 and second peripheral area LA2.

The first peripheral area LA1 includes a region to which laser beams are irradiated to remove a predetermined layer, and includes dams D1 and D2, for example, first and second dams D1 and D2. The portion to which laser beams are irradiated includes the dams D1 and D2 and peripheral areas thereof. The first peripheral area LA1 represents a portion for preventing damage to elements and wires positioned in the display area DA when laser beams are irradiated and a process for incising or cutting the opening area DTA is performed.

The second peripheral area LA2 is a region in which a portion RDL (also referred to as a roundabout portion) in which the data line DL extends along a peripheral portion of the opening area DTA is disposed. As a result, in case that the data line DL fails to have a straight line structure because of the opening area DTA, pixels PX positioned at the top and bottom portion of the opening area DTA are electrically connected to each other by a data line DL by virtue of the portion RDL bent along the peripheral portion of the opening area DTA.

The first peripheral area LA1 is positioned nearer to the opening area DTA than the second peripheral area LA2 is, and the second peripheral area LA2 is positioned nearer to the display area DA than the first peripheral area LA1 is.

In the embodiment, the scan line SL is not formed in the second peripheral area LA2 and a detouring structure is not included. For example, a right and a left portion of the scan line SL electrically connected to the pixel PX positioned on the right and left portion of the opening area DTA are short-circuited with respect to the opening area DTA. However, depending on embodiments, the scan lines SL on the right and left portion may be electrically connected to each other in case that a roundabout portion is formed in the second peripheral area LA2.

A circuit configuration of a pixel according to an embodiment will now be described with reference to FIG. 5.

Figure 5:
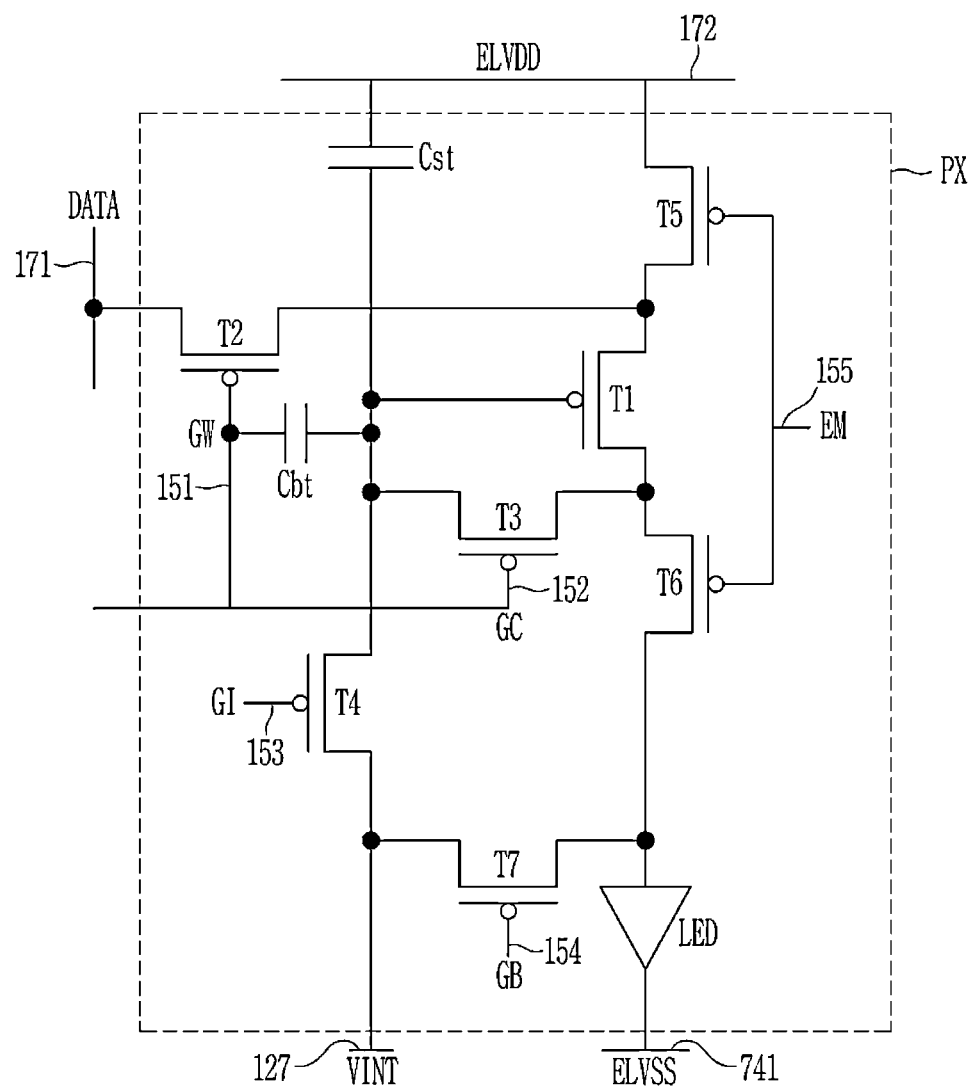
FIG. 5 illustrates a schematic circuit diagram of a pixel according to an embodiment.

FIG. 5 illustrates a schematic circuit diagram of a pixel according to an embodiment.

A pixel PX includes a pixel circuit including transistors and a capacitor, and a light emitting diode LED for receiving a current from the pixel circuit and emitting light.

As shown in FIG. 5, a pixel PX of a display device according to an embodiment includes transistors T1, T2, T3, T4, T5, T6, and T7 electrically connected to wires 127, 151, 152, 153, 154, 155, 171, 172, and 741, a storage capacitor Cst, a boost capacitor Cbt, and a light emitting diode LED.

A pixel PX is electrically connected to the wires 127, 151, 152, 153, 154, 155, 171, 172, and 741. The wires 127, 151, 152, 153, 154, 155, 171, 172, and 741 include a first initialization voltage line 127, a first scan signal line 151, a second scan signal line 152, an initialization control line 153, a bypass control line 154, an emission control line 155, a data line 171, a driving voltage line 172, and a common voltage line 741.

The wire simplified as the scan line SL in FIGS. 3 and 4 is classified and illustrated in detail as the first initialization voltage line 127, the first scan signal line 151, the second scan signal line 152, the initialization control line 153, the bypass control line 154, and the emission control line 155 in FIG. 5.

The first scan signal line 151 is electrically connected to a scan driver and transmits a first scan signal GW to the second transistor T2. The second scan signal line 152 may be the same as the first scan signal line 151 and may transmit a second scan signal GC, which is the same as the first scan signal GW, to the third transistor T3.

The initialization control line 153 transmits an initialization control signal GI to the fourth transistor T4. The bypass control line 154 transmits a bypass signal GB to the seventh transistor T7. The bypass control line 154 may be formed of the first scan signal line 151 at a previous stage. The emission control line 155 transmits an emission control signal EM to the fifth transistor T5 and the sixth transistor T6.

The data line 171 corresponds to the data line DL of FIGS. 3 and 4 and is a wire for transmitting the data voltage DATA generated by the data driver 50, and luminance of light emitted by the light emitting diode LED is changed according to the data voltage DATA applied to the pixel PX.

The driving voltage line 172 corresponds to the driving voltage line PL of FIG. 3 and applies the driving voltage ELVDD. The first initialization voltage line 127 transmits a first initialization voltage VINT. The common voltage line 741 applies the the common voltage ELVSS to a cathode of the light emitting diode LED. In the embodiment, voltages may be applied to the driving voltage line 172, the first initialization voltage line 127, and the common voltage line 741.

Transistors included in the pixel circuit may include a driving transistor T1, a second transistor T2, a third transistor T3, a fourth transistor T4, a fifth transistor T5, a sixth transistor T6, and a seventh transistor T7. The transistors may include polycrystalline silicon semiconductors.

The second transistor T2 transmits the data voltage DATA to the pixel PX, the fourth transistor T4 initializes a voltage of a gate electrode of the driving transistor T1 to be a first initialization voltage VINT, and the seventh transistor T7 initializes an anode voltage of the light emitting diode LED to be the first initialization voltage VINT.

The fifth transistor T5 transmits the driving voltage ELVDD to the driving transistor T1, the sixth transistor T6 transmits an output current of the driving transistor T1 to the light emitting diode LED, and a section in which the fifth transistor T5 and the sixth transistor T6 are turned on may be a light emitting section.

The third transistor T3 electrically connects the gate electrode of the driving transistor T1 and an output electrodeon an output side so that the data voltage DATA may pass through the driving transistor T1 and may be stored in a storage capacitor Cst electrically connected to the gate electrode of the driving transistor T1. In this instance, the voltage finally stored in the storage capacitor Cst may be a voltage generated by compensating the threshold voltage of the driving transistor T1.

The driving transistor T1 generates an output current based on the voltage stored in the storage capacitor Cst and outputs the same.

A boost capacitor Cbt reduces the voltage at the gate electrode of the driving transistor T1 in case that the first scan signal GW applied to the first scan signal line 151 is changed to a low-voltage signal to turn on the second transistor T2. As a result, the driving transistor T1 may maintain a turned-on state.

A pixel PX has been described in the above as including seven transistors T1 to T7, a storage capacitor Cst, and a boost capacitor Cbt, and without being limited thereto, the number of transistors, the number of capacitors, and their connection relationships are modifiable in many ways. Particularly, depending on embodiments, the transistors such as the third transistor T3, the fourth transistor T4, and/or the seventh transistor T7 may include oxide semiconductors with an N-MOS characteristic as semiconductor layers, and it may be turned on in case that a high-level voltage is transmitted to the gate electrode.

A cross-sectional configuration of a display panel will now be described with reference to FIGS. 6 to 8.

Figure 6:
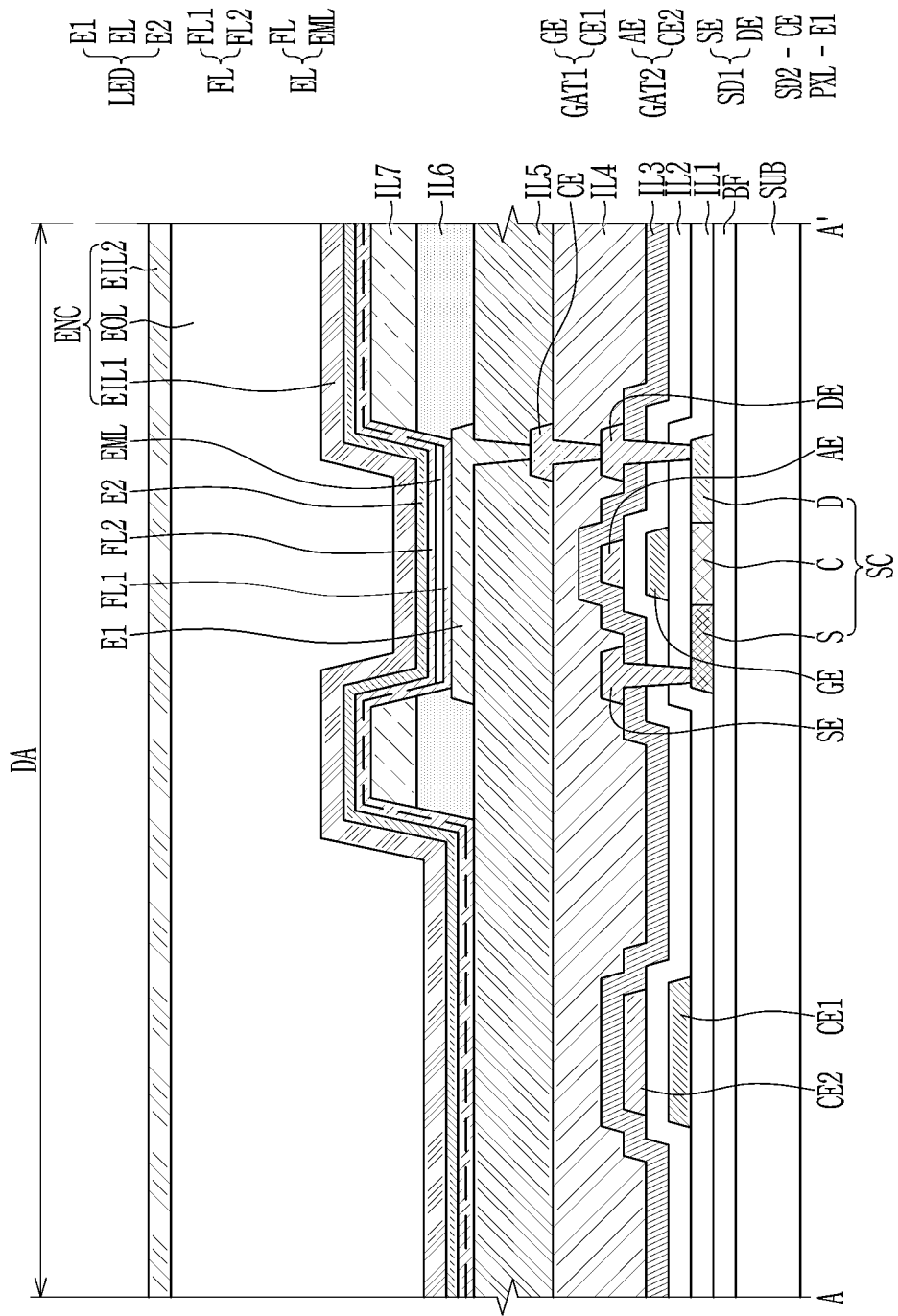
FIG. 6 illustrates a schematic cross-sectional view of a pixel included in a display area of a display panel according to an embodiment.
Figure 7:
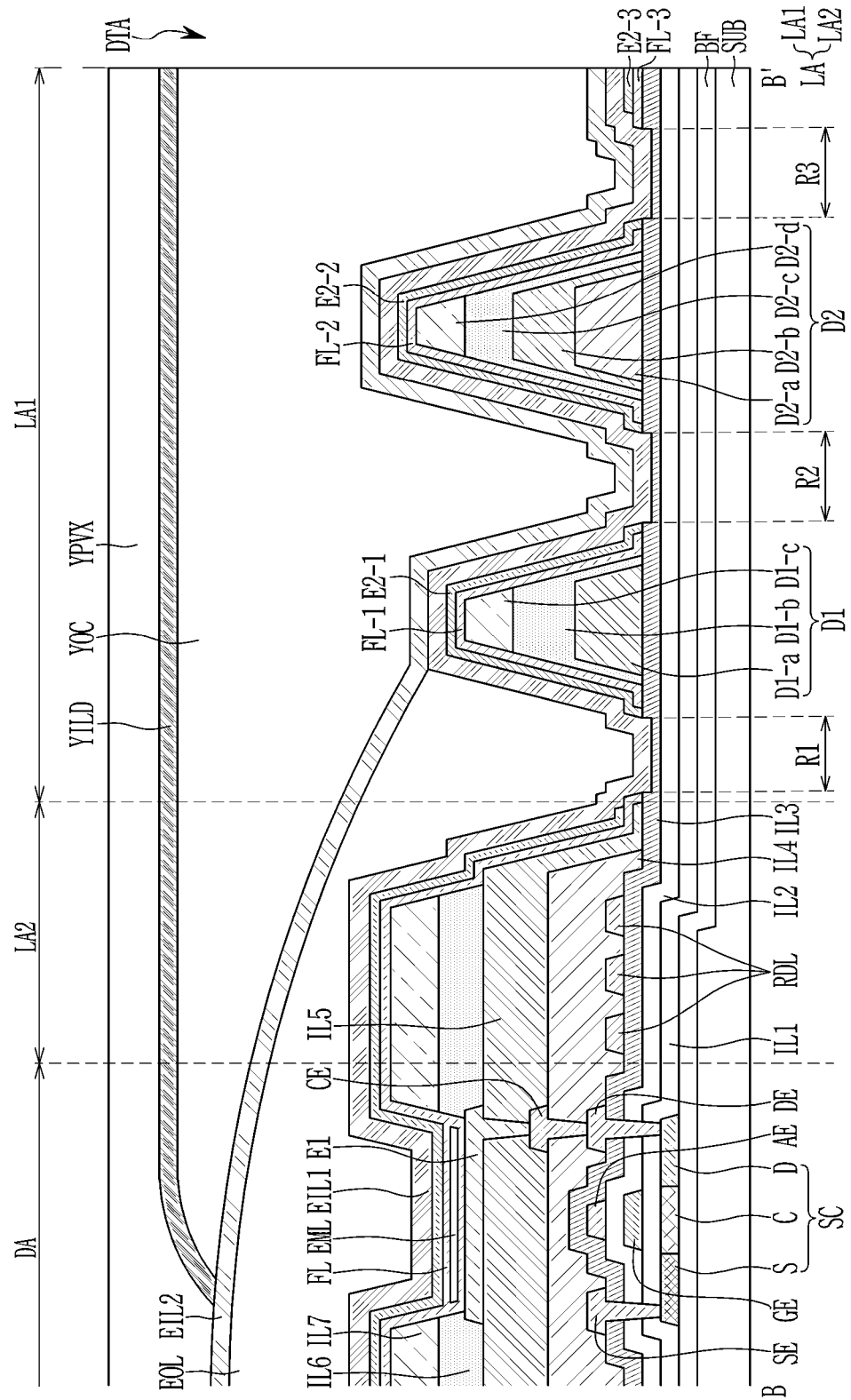
FIG. 7 illustrates a schematic cross-sectional view of a display panel in which a peripheral area and an opening area are positioned according to an embodiment.
Figure 8:
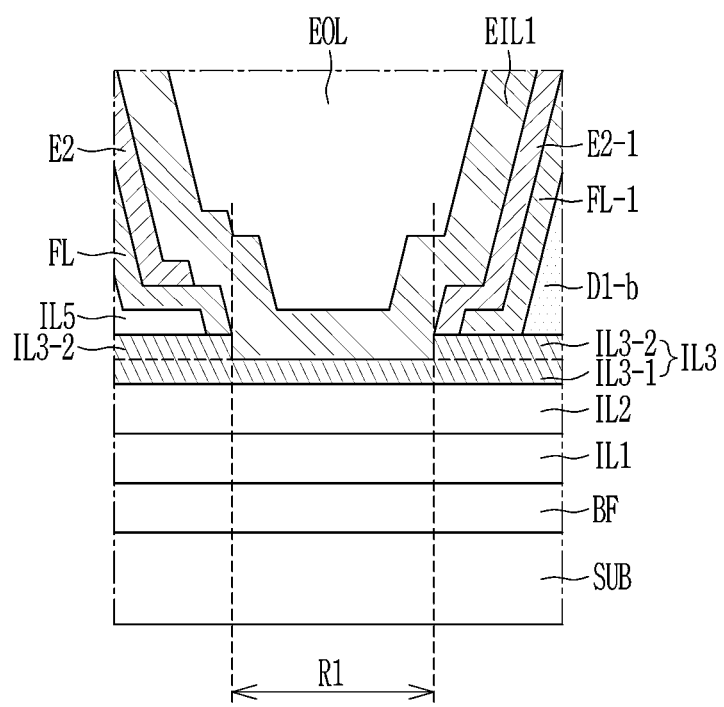
FIG. 8 illustrates a schematic enlarged cross-sectional view of a portion from which a functional layer and a second electrode are removed from a display panel according to an embodiment.

FIG. 6 illustrates a schematic cross-sectional view of a pixel included in a display area of a display panel according to an embodiment, FIG. 7 illustrates a schematic cross-sectional view of a display panel in which a peripheral area and an opening area are positioned according to an embodiment, and FIG. 8 illustrates a schematic enlarged cross-sectional view of a portion, from which a functional layer and a second electrode are removed from a display panel according to an embodiment.

A cross-sectional configuration of a display area DA will now be described with reference to FIG. 6.

A substrate SUB according to an embodiment may include an inorganic insulating material such as glass, or an organic insulating material such as plastic such as a polyimide (PI). The substrate SUB may be a single layer or a multi-layer. The substrate SUB may have a structure in which at least one base layer including sequentially stacked polymer resins and at least one inorganic layer are alternately stacked.

The substrate SUB may have various degrees of flexibility. The substrate SUB may be a rigid substrate or a flexible substrate that may be bent, folded, or rolled.

A buffer layer BF may be positioned on the substrate SUB. The buffer layer BF may prevent degradation in the characteristic of a semiconductor layer SC and may ease a stress by blocking transmission of impurities to an upper layer of the buffer layer (BF) from the substrate (SUB), particularly, to the semiconductor layer SC. The buffer layer BF may include an inorganic insulating material such as a silicon nitride or a silicon oxide, or an organic insulating material. A portion or an entire body of the buffer layer BF may be omitted. Depending on embodiments, a metal layer (not shown) may be formed between the substrate SUB and the buffer layer BF. The metal layer may be formed to maintain the characteristic of the semiconductor layer SC.

The semiconductor layer SC is positioned on the buffer layer BF. The semiconductor layer SC may include polysilicon. The semiconductor layer SC includes a channel region C, a first region S, and a second region D. The first region S and the second region D are disposed on respective sides of the channel region C. The channel region C is a semiconductor region which is doped with a small amount of impurities or with no impurity, compared to the first region S and the second region D, and the first region S and the second region D are semiconductor regions which are doped with a large amount of impurities, compared to the channel region C.

A first insulating layer IL1 is positioned on the semiconductor layer SC. The first insulating layer IL1 may have a single or multi-layered structure including at least one of a silicon oxide ($SiO_x$), a silicon nitride ($SiN_x$), and a silicon oxynitride ($SiO_xN_y$).

A first gate conductive layer GAT1 including a gate electrode GE and a first capacitor electrode CE1 is positioned on the first insulating layer IL1. The first gate conductive layer GAT1 may be a single layer or a multi-layer in which a metal layer including one of copper (Cu), a copper alloy, aluminum (Al), an aluminum alloy, molybdenum (Mo), a molybdenum alloy, titanium (Ti), and a titanium alloy is stacked. The gate electrode GE may overlap the channel region C of the semiconductor layer SC in a plan view.

A second insulating layer IL2 is positioned on the first gate conductive layer GAT1 and the first insulating layer IL1. The second insulating layer IL2 may be a single layer or a multi-layer including at least one of a silicon oxide ($SiO_x$), a silicon nitride ($SiN_x$), and a silicon oxynitride ($SiO_xN_y$).

A second gate conductive layer GAT2 including an upper electrode AE and a second capacitor electrode CE2 is positioned on the second insulating layer IL2. The second capacitor electrode CE2 and the upper electrode AE may be different regions of a conductive pattern. The second capacitor electrode CE2 may be electrically connected to the upper electrode AE. The second gate conductive layer GAT2 may be a single layer or a multi-layer in which a metal layer including one of copper (Cu), a copper alloy, aluminum (Al), an aluminum alloy, molybdenum (Mo), a molybdenum alloy, titanium (Ti), and a titanium alloy is stacked.

The first capacitor electrode CE1 and the second capacitor electrode CE2 overlap each other to configure a storage capacitor Cst.

A third insulating layer IL3 is positioned on the second gate conductive layer GAT2 and the second insulating layer IL2. The third insulating layer IL3 may be a single layer or a multi-layer including at least one of a silicon oxide ($SiO_x$), a silicon nitride ($SiN_x$), and a silicon oxynitride ($SiO_xN_y$).

A first data conductive layer SD1 including a source electrode SE and a drain electrode DE is positioned on the third insulating layer IL3. The source electrode SE and the drain electrode DE may be electrically connected to the first region S and the second region D of the semiconductor layer SC through contact holes formed in the third insulating layer IL3 and the first and second inorganic insulating layers IL1 and IL2. Depending on embodiments, the semiconductor layer SC may directly extend to be electrically connected to an adjacent pixel without the source electrode SE and the drain electrode DE. The first data conductive layer SD1 may include aluminum (Al), silver (Ag), magnesium (Mg), gold (Au), nickel (Ni), chromium (Cr), nickel (Ni), calcium (Ca), molybdenum (Mo), titanium (Ti), tungsten (W), and/or copper (Cu), and it may have a single or multi-layer structure including the same. The first data conductive layer SD1 has a triple-layer structure in which aluminum (Al) is disposed between two layers of titanium (Ti), and it will be mainly described focusing on the triple-layer structure of Ti/Al/Ti.

A first organic insulating layer IL4 and a second organic insulating layer IL5 are sequentially positioned on the third insulating layer IL3 and the first data conductive layer SD1. The first organic insulating layer IL4 and the second organic insulating layer IL5 may include a general polymer such as polymethylmethacrylate (PMMA) or polystyrene (PS), a polymer derivative having a phenol-based group, and an organic insulating material such as an acryl-based polymer, an imide-based polymer, a polyimide, and a siloxane-based polymer.

A connecting member CE may be positioned between the first organic insulating layer IL4 and the second organic insulating layer IL5. The connecting member CE configures a second data conductive layer SD2 and may electrically connect the drain electrode DE and the first electrode E1. The second data conductive layer SD2 may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and it may have a single-layer or multi-layer structure including the same. The second data conductive layer SD2 has a triple-layer structure in which aluminum (Al) is disposed between two layers of titanium (Ti) in a similar way to the first data conductive layer SD1, and it will be mainly described with the focus on the triple-layer structure of Ti/Al/Ti A first electrode E1 (also referred to as a pixel electrode or an anode) is positioned on the second organic insulating layer IL5. The first electrode E1 forms a pixel electrode layer PXL and is electrically connected to the connecting member CE through a contact hole of the second organic insulating layer IL5. The first electrode E1 is electrically connected to the drain electrode DE. The first electrode E1 may include a metal such as silver (Ag), lithium (Li), calcium (Ca), aluminum (Al), magnesium (Mg), and gold (Au) and may include a transparent conductive oxide (TCO) such as an indium tin oxide (ITO) and an indium zinc oxide (IZO). The first electrode E1 may be made of (or include) a single layer including a metal material or a transparent conductive oxide, or a multi-layer including them. The first electrode E1 may have a triple-layer structure of indium tin oxide (ITO)/silver (Ag)/indium tin oxide (ITO), and it will be described with the focus on the structure of ITO/Ag/ITO.

The gate electrode GE and the semiconductor layer SC configure a transistor and may include a source electrode SE and a drain electrode DE electrically connected to the first region S and the second region D of the semiconductor layer SC depending on transistors. Depending on transistors, the transistor may be configured with the gate electrode GE and the semiconductor layer SC without using the source electrode SE and the drain electrode DE. The transistor (for example, the sixth transistor T6 of FIG. 5) is electrically connected to the first electrode E1 and supplies a current to the light-emitting device LED.

A pixel defining layer IL6 and a spacer IL7 are positioned on the second organic insulating layer IL5 and the first electrode E1.

The pixel defining layer IL6 overlaps at least part of the first electrode E1 and has an opening for defining a light emitting region. The opening may have a planar shape that is substantially similar to that of the first electrode E1. The opening may have a rhombic shape or an octagonal shape that is similar to the rhombic shape in a plan view, but the disclosure is not limited thereto. The opening may have various shapes such as a quadrangle, a polygon, a circle, and an oval.

The pixel defining layer IL6 and the spacer IL7 may include a general polymer such as polymethylmethacrylate (PMMA) or polystyrene (PS), a polymer derivative having a phenol-based group, and an organic insulating material such as an acryl-based polymer, an imide-based polymer, a polyimide, and a siloxane-based polymer.

An intermediate layer EL is positioned on the pixel defining layer IL6, the spacer IL7, and the first electrode E1. The intermediate layer EL may include an emission layer EML and a functional layer FL. The emission layer EML of the intermediate layer EL may generate a predetermined color light. The emission layer EML may include an organic material and/or an inorganic material. The emission layer EML is formed in the opening of the pixel defining layer IL6.

Of the intermediate layer EL, a functional layer FL may include at least one of a hole injection layer (HIL), a hole transporting layer (HTL), an electron transporting layer (ETL), and an electron injection layer (EIL). The functional layer FL may be divided into a first functional layer FL1 positioned between the first electrode E1 and the emission layer EML and a second functional layer FL2 positioned between the emission layer EML and the second electrode E2. Each functional layer FL may overlap a front side of the substrate SUB. The functional layer FL may be disposed on and across pixels.

A second electrode E2 is positioned on the intermediate layer EL. The second electrode E2 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), and lithium (Li), or a transparent conductive oxide (TCO) such as an indium tin oxide (ITO) and an indium zinc oxide (IZO).

The first electrode E1, the intermediate layer EL, and the second electrode E2 may configure a light-emitting device LED. Here, the first electrode E1 may be an anode that is a hole injection electrode, and the second electrode E2 may be a cathode that is an electron injection electrode. However, the embodiment is not limited thereto, and the first electrode E1 may be a cathode, and the second electrode E2 may be an anode, depending on methods for driving an emissive display device.

Holes and electrons are injected into the emission layer EL from the first electrode E1 and the second electrode E2, and light emits in case that excitons that are a combination of the injected holes and electrons fall to the ground state from the excited state.

An encapsulation layer ENC is positioned on the second electrode E2. The encapsulation layer ENC may cover (or overlap) an upper side of the light-emitting device LED and a lateral side thereof to seal the same. The light-emitting device LED may be vulnerable to moisture and oxygen, so the encapsulation layer ENC seals the light-emitting device LED to block an inflow of external moisture and oxygen.

The encapsulation layer ENC may include layers, it may be made as complex layers including an inorganic layer and an organic layer, and for example, it may be formed as triple layers configured by sequentially stacking a first encapsulation inorganic layer EIL1, an encapsulation organic layer EOL, and a second encapsulation inorganic layer EIL2.

The first encapsulation inorganic layer EIL1 may cover the second electrode E2. The first encapsulation inorganic layer EIL1 may prevent external moisture or oxygen from permeating into the light-emitting device LED. For example, the first encapsulation inorganic layer EIL1 may include a silicon nitride, a silicon oxide, or a combined compound thereof. The first encapsulation inorganic layer EIL1 may be made by a deposition process.

The encapsulation organic layer EOL may be disposed on the first encapsulation inorganic layer EIL1 to contact the first encapsulation inorganic layer EIL1. Curves formed on a top side of the first encapsulation inorganic layer EIL1 or particles present on the first encapsulation inorganic layer EIL1 are covered (or overlapped) by the encapsulation organic layer EOL, so a surface state of the top side of the first encapsulation inorganic layer EIL1 may block an influence applied to the constituent elements on the encapsulating organic layer EOL. The encapsulation organic layer EOL may also ease the stress among the contact layers. The encapsulation organic layer EOL may include an organic material and may be formed by a solution process such as a spin coating, a slit coating, or an inkjet process.

The second encapsulation inorganic layer EIL2 is disposed on the encapsulation organic layer EOL to cover the encapsulation organic layer EOL. The second encapsulation inorganic layer EIL2 may be more stably positioned on a relative planar side than is disposed on the first encapsulation inorganic layer EIL1. The second encapsulation inorganic layer EIL2 encapsulates the moisture discharged by the encapsulation organic layer EOL to prevent the inflow thereof to the outside. The second encapsulation inorganic layer EIL2 may include a silicon nitride, a silicon oxide, or a combined compound thereof. The second encapsulation inorganic layer EIL2 may be formed by a deposition process.

Although not shown in the drawings, a capping layer positioned between the second electrode E2 and the encapsulation layer ENC may be further included. The capping layer may include an organic material. The capping layer protects the second electrode E2 from a subsequent process, for example, a sputtering process and improves light outputting efficiency of the light-emitting device LED. The capping layer may have a greater refractive index than the first encapsulation inorganic layer EIL1.

FIG. 6 illustrates a transistor, and the actual pixels may respectively include transistors as shown in FIG. 5.

The cross-sectional structure of the display area DA may have a cross-sectional structure shown in FIG. 7 as it extends to the peripheral area LA and the opening area DTA.

FIG. 7 illustrates that nothing is formed in the opening area DTA, and further illustrates additional insulating layers (an additional overcoat layer YOC, an additional inorganic insulating layer YILD, and an additional planarization layer YPVX) for covering the peripheral area LA and the display area DA. Depending on embodiments, at least some of the additional insulating layers may be omitted, and referring to FIG. 22, a structure in which the additional planarization layer YPVX is formed as an additional insulating layer without the additional overcoat layer YOC and the additional inorganic insulating layer YILD, may be provided. Depending on embodiments, a touch electrode may be additionally formed between the encapsulation layer ENC and the additional planarization layer YPVX in the display area DA to sense a touch.

The peripheral area LA is divided into a first peripheral area LA1 and a second peripheral area LA2. FIG. 7 illustrates that a width of the second peripheral area LA2 is less than a width of the first peripheral area LA1, but the first peripheral area LA1 and the second peripheral area LA2 may have various widths depending on embodiments, and the disclosure is not limited thereto.

The first peripheral area LA1 includes dams D1 and D2, and includes regions (e.g., a first open region R1, a second open region R2, and a third open region R3) from which the functional layer FL and the second electrode E2 are removed. The first peripheral area LA1 includes a region in which laser beams are irradiated to the sacrificial layer SFL (refer to FIGS. 10A to 10D and 11A and 11B) so as to form the regions (the first open region R1, the second open region R2, and the third open region R3) from which the functional layer FL and the second electrode E2 are removed. The laser beams may be irradiated to the dams D1 and D2 and the region (the first open region R1, the second open region R2, and the third open region R3) from which the functional layer FL and the second electrode E2 are removed. The first peripheral area LA1 prevents damage to the elements and the wires positioned in the display area DA in case that the laser beams are irradiated and the process for incising an opening area DTA is performed.

The second peripheral area LA2 represents a region in which a roundabout portion RDL on which a data line DL extends along a peripheral portion of the opening area DTA is disposed. As a result, in case that the data line DL fails to have a straight line structure because of the opening area DTA, pixels PX positioned at the top and bottom portion of the opening area DTA are electrically connected to each other by a data line DL because of the roundabout portion (RDL) detouring along the peripheral portion of the opening area (DTA). In an embodiment described with reference to FIG. 7, the roundabout portion is positioned on the first data conductive layer SD1 and is positioned on the third insulating layer IL3.

The buffer layer BF, the first insulating layer IL1, and the second insulating layer IL2 sequentially extend from the display area DA on the substrate SUB in the peripheral area LA. The third insulating layer IL3 sequentially extends from the display area DA, and its thickness is reduced in the regions (the first open region R1, the second open region R2, and the third open region R3) from which the functional layer FL and the second electrode E2 are removed in the first peripheral area LA1. This is because, in case that the first open region R1, the second open region R2, and the third open region R3 are formed, the functional layer FL and the second electrode E2 are removed together with the sacrificial layer SFL made of a metal, and part of the third insulating layer IL3 position at the bottom portion is removed altogether. Depending on embodiments, the third insulating layer IL3 may have a double-layer structure including a 3-1-th inorganic insulating layer IL3-1(this layer may also be mentioned as an first inorganic insulating layer) made of (or include) a silicon oxide ($SiO_x$) and a 3-2-th inorganic insulating layer IL3-2(this layer may also be mentioned as an second inorganic insulating layer) made of a silicon nitride ($SiN_x$), positioned thereon. Referring to FIG. 8, regarding the third insulating layer IL3 with a double-layer structure, the 3-2-th inorganic insulating layer IL3-2 may be removed and the 3-1-th inorganic insulating layer IL3-1 may remain in the first open region R1, the second open region R2, and the third open region R3 of the first peripheral area LA1.

In the second peripheral area LA2, a roundabout portion RDL is positioned on the third insulating layer IL3, and a first organic insulating layer IL4, a second organic insulating layer IL5, a pixel defining layer IL6, a spacer IL7, a functional layer FL, a second electrode E2, and an encapsulation layer ENC are sequentially formed thereon. An additional overcoat layer YOC, an additional inorganic insulating layer YILD, and an additional planarization layer YPVX, which are additional insulating layers, may be further formed on the encapsulation layer ENC.

In the first peripheral area LA1, different layered structures are provided in the portion where the dams D1 and D2 are positioned and the regions (the first open region R1, the second open region R2, and the third open region R3) from which the functional layer FL and the second electrode E2 are removed.

The layered structure of the regions (first open region R1, second open region R2, and third open region R3) from which the functional layer FL and the second electrode E2 are removed will now be described.

A substrate SUB, a buffer layer BF, a first insulating layer IL1, a second insulating layer IL2, a third insulating layer IL3, a first encapsulation inorganic layer EIL1, and a second encapsulation inorganic layer EIL2 are sequentially stacked in the first open region R1, the second open region R2, and the third open region R3. An encapsulation organic layer EOL is further formed between the first encapsulation inorganic layer EIL1 and the second encapsulation inorganic layer EIL2 in the first open region R1 positioned near the display area DA. Depending on embodiments, an encapsulation organic layer EOL may be further formed up to the second open region R2 or the third open region R3. In this instance, the encapsulation organic layer EOL of the encapsulation layer ENC that is not exposed to the outside may be able to block moisture and oxygen, so an end of the encapsulation organic layer EOL may be formed to be covered (or overlapped) by the first encapsulation inorganic layer EIL1 and the second encapsulation inorganic layer EIL2 and not to be exposed to the outside. In an embodiment described with reference to FIG. 7, the first encapsulation inorganic layer EIL1 contacts the second encapsulation inorganic layer EIL2 on the first dam D1. However, a position where the first encapsulation inorganic layer EIL1 contacts the second encapsulation inorganic layer EIL2 may be near the second dam D2.

The functional layer FL and the second electrode E2 are opened and disconnected in the first open region R1, the second open region R2, and the third open region R3 according to the layered structure of the first open region R1, the second open region R2, and the third open region R3.

The thickness of the third insulating layer IL3 is reduced in the first open region R1, the second open region R2, and the third open region R3. The above-noted structure may be formed as the functional layer FL and the second electrode E2 are removed together with the sacrificial layer made of a metal and part of the third insulating layer IL3 positioned therebelow is also removed when the first open region R1, the second open region R2, and the third open region R3 are formed. Further, in case that the third insulating layer IL3 has a double-layer structure including a 3-1-th inorganic insulating layer IL3-1 made of a silicon oxide ($SiO_x$) and a 3-2-th inorganic insulating layer IL3-2 made of a silicon nitride ($SiN_x$) formed thereon according to an embodiment, the 3-2-th inorganic insulating layer IL3-2 made of a silicon nitride ($SiN_x$) may be removed and the 3-1-th inorganic insulating layer IL3-1 may remain as shown in FIG. 8. The inorganic insulating layer IL3-2 may be disconnected or may not be disposed in at least a portion of the first open region R1 in which the emission layer EML and the second electrode E2 are disconnected in the peripheral area.

A layered structure of regions where dams D1 and D2 of a first peripheral area LA1 are positioned will now be described.

At least two dams D1 and D2 may be positioned in the first peripheral area LA1. For example, the first dam D1 and the second dam D2 may be positioned in the stated order from the display area DA. The first dam D1 and the second dam D2 are disposed on the substrate SUB, the buffer layer BF, the first insulating layer IL1, the second insulating layer IL2, and the third insulating layer IL3. Configurations of the respective dams D1 and D2 positioned on the third insulating layer IL3 will now be described in detail.

The first dam D1 may include a 1-1-th sub-dam D1-*a*, a 1-2-th sub-dam D1-*b*, and a 1-3-th sub-dam D1-*c*. The 1-1-th sub-dam D1-*a* and the second organic insulating layer IL5 positioned in the display area DA may be positioned on a same layer and may include a same material. The 1-1-th sub-dam D1-*a* and the second organic insulating layer IL5 positioned in the display area DA may be formed by a same process. The 1-2-th sub-dam D1-*b* and the pixel defining layer IL6 positioned in the display area DA may be positioned on a same layer and may include a same material. The 1-2-th sub-dam D1-*b* and the pixel defining layer IL6 positioned in the display area DA may be formed by a same process. The 1-3-th sub-dam D1-*c*, and the spacer IL7 positioned in the display area DA may be positioned on a same layer and may include a same material. The 1-3-th sub-dam D1-*c* and the spacer IL7 positioned in the display area DA may be formed by a same process.

The second dam D2 may include a 2-1-th sub-dam D2-*a*, a 2-2-th sub-dam D2-*b*, a 2-3-th sub-dam D2-*c*, and a 2-4-th sub-dam D2-*d*. The 2-1-th sub-dam D2-*a*, and the first organic insulating layer IL4 positioned in the display area DA may be positioned on a same layer and may include a same material. The 2-1-th sub-dam D2-*a*, and the first organic insulating layer IL4 positioned in the display area DA may be formed by a same process. The 2-2-th sub-dam D2-*b* and the second organic insulating layer IL5 positioned in the display area DA may be positioned on a same layer and may include a same material. The 2-2-th sub-dam D2-*b* and the second organic insulating layer IL5 positioned in the display area DA may be formed by a same process. The 2-3-th sub-dam D2-*c* and the pixel defining layer IL6 positioned in the display area DA may be positioned on a same layer and may include a same material. The 2-3-th sub-dam D2-*c* and the pixel defining layer IL6 positioned in the display area DA may be formed by a same process. The 2-4-th sub-dam D2-*d* and the spacer IL7 positioned in the display area DA may be positioned on a same layer and may include a same material. The 2-4-th sub-dam D2-*d* and the spacer IL7 positioned in the display area DA may be formed by a same process.

FIG. 7 illustrates an embodiment in which the first dam D1 has a triple-layer structure and the second dam D2 has a quadruple-layer structure. However, the disclosure is not limited thereto, and the first dam D1 may have a quadruple-layer structure, and the second dam D2 may have a triple-layer structure to thus change the positions, the first dam D1 and the second dam D2 may have triple-layer structures, or the first dam D1 and the second dam D2 may have quadruple-layer structures. A dam with a double-layer structure including part of the above-noted sub-dam may also be provided. FIG. 7 illustrates the embodiment in which two dams D1 and D2 are positioned in the peripheral area LA. However, the disclosure limited thereto, and at least two dams may be positioned in the peripheral area LA. Referring to FIG. 7, the region from which the functional layer FL and the second electrode E2 are removed may be positioned on respective sides of a dam, and the region from which the functional layer FL and the second electrode E2 are removed may be positioned on a side thereof. As the number of dams is changed, the number of the regions from which the functional layer FL and the second electrode E2 are removed may also be changed.

The dams D1 and D2 shown in the specification may have a ring shape surrounding the opening area DTA in a plan view as shown in FIG. 4. The regions (the first open region R1, the second open region R2, and the third open region R3) from which the functional layer FL and the second electrode E2 are removed may have ring shapes positioned on the dams D1 and D2 in a plan view. This is, however, an example of the shape, and they may have a polygon, an oval, or a closed-line shape including at least a partial curved line instead of the ring shape, or they may be provided in a shape including patterns that are partially cut, and they are not limited to an embodiment.

A 1-1-th layer FL-1 may be positioned on the first dam D1. A 1-2-th layer FL-2 may be positioned on the second dam D2. A 1-3-th layer FL-3 may be positioned between the second dam D2 and the opening area DTA. The 1-1-th layer FL-1, the 1-2-th layer FL-2, and the 1-3-th layer FL-3 and the functional layer FL may include a same material and may be formed by a same process.

A 2-1-th layer E2-1, a 2-2-th layer E2-2, and a 2-3-th layer E2-3 may be positioned on the 1-1-th layer FL-1, the 1-2-th layer FL-2, and the 1-3-th layer FL-3. The 2-1-th layer E2-1, the 2-2-th layer E2-2, and the 2-3-th layer E2-3 and the second electrode E2 may have a same material and may be formed by a same process.

The second open region R2 is positioned between the 1-1-th layer FL-1 and the 2-1-th layer E2-1 that are sequentially stacked and the 1-2-th layer FL-2 and the 2-2-th layer E2-2 that are sequentially stacked, and the third open region R3 is positioned between the 1-2-th layer FL-2 and the 2-2-th layer E2-2 that are sequentially stacked and the 1-3-th layer FL-3 and the 2-3-th layer E2-3 that are sequentially stacked. The 1-1-th layer FL-1 and the 2-1-th layer E2-1 that are sequentially stacked are separated from the functional layer FL and the second electrode E2 by the first open region R1.

The first encapsulation inorganic layer EIL1 extending from the display area DA may be positioned in the peripheral area LA. An end of the encapsulation organic layer EOL extending from the display area DA may be positioned in the peripheral area LA. The first dam D1 may control spreading of a material in a process for forming an encapsulation organic layer EOL. The encapsulation organic layer EOL may fill a space between the end of the display area DA and the first dam D1. The second encapsulation inorganic layer EIL2 overlapping the front side of the substrate SUB may be positioned on the encapsulation organic layer EOL.

The first encapsulation inorganic layer EIL1, the encapsulation organic layer EOL, and the second encapsulation inorganic layer EIL2 may be positioned on the first insulating layer IL1 in the first open region R1. The first encapsulation inorganic layer EIL1 and the second encapsulation inorganic layer EIL2 may be positioned on the first insulating layer IL1 in the second open region R2. The first encapsulation inorganic layer EIL1 and the second encapsulation inorganic layer EIL2 may be positioned on the first insulating layer IL1 in the third open region R3.

The above-described first electronic module may be inserted into the opening area DTA as shown in FIG. 2. An internal side of the opening area DTA may be defined by ends of the substrate SUB, the buffer layer BF, the first insulating layer IL1 the second insulating layer IL2, the third insulating layer IL3, the 1-3-th layer FL-3, the 2-1-th layer E2-1, the first encapsulation inorganic layer EIL1, the second encapsulation inorganic layer EIL2, the additional overcoat layer YOC, the additional inorganic insulating layer YILD, and the additional planarization layer YPVX. The substrate SUB, the buffer layer BF, the first insulating layer IL1, the second insulating layer IL2, the third insulating layer IL3, the 1-3-th layer FL-3, the 2-1-th layer E2-1, the first encapsulation inorganic layer EIL1, the second encapsulation inorganic layer EIL2, the additional overcoat layer YOC, the additional inorganic insulating layer YILD, and the additional planarization layer YPVX are cut together, and the ends of the respective layers are aligned with each other. However, the disclosure is not limited thereto, and it is obvious that some of the above-noted constituent elements may be omitted or added to configure the internal side of the opening area DTA.

The first open region R1, which is one of the regions from which the functional layer FL and the second electrode E2 are removed, and its peripheral portion will be enlarged and described with reference to FIG. 8.

As shown in FIG. 8, the substrate SUB, the buffer layer BF, the first insulating layer IL1, the second insulating layer IL2, the third insulating layer IL3, the first encapsulation inorganic layer EIL1, and the encapsulation organic layer EOL are sequentially stacked in the first open region R1, and referring to FIG. 7, the second encapsulation inorganic layer EIL2 is stacked on the encapsulation organic layer EOL.

Insulating layers are stacked in the first open region R1, and some (the first organic insulating layer IL4, the second organic insulating layer IL5, the pixel defining layer IL6, and the spacer IL7) of various insulating layers positioned on the third insulating layer IL3 are removed in the display area DA. For example, the respective insulating layers IL4, IL5, IL6, and IL7 are formed, so that the corresponding insulating layers IL4, IL5, IL6, and IL7 may be removed in the open regions R1, R2, and R3.

The functional layer FL and the second electrode E2 positioned on the spacer IL7, and the 1-1-th layer FL-1 and the 2-1-th layer E2-1 are made of (or include) a same material, and they are separated from each other with respect to the first open region R1 in case that the first open region R1 is formed. The 1-2-th layer FL-2, the 1-3-th layer FL-3, the 2-2-th layer E2-2, and the 2-3-th layer E2-3, and the functional layer FL and the second electrode E2 may be made of same materials, and the 1-2-th layer FL-2 and the 2-2-th layer E2-2, and the 1-3-th layer FL-3 and the 2-3-th layer E2-3 are separated with respect to the third open region R3.

The first encapsulation inorganic layer EIL1 positioned on the second electrode E2 is continuously formed on respective sides of the first open region R1.

An order for manufacturing a display panel will now be described with reference to FIGS. 9 to 11B.

Figure 9:
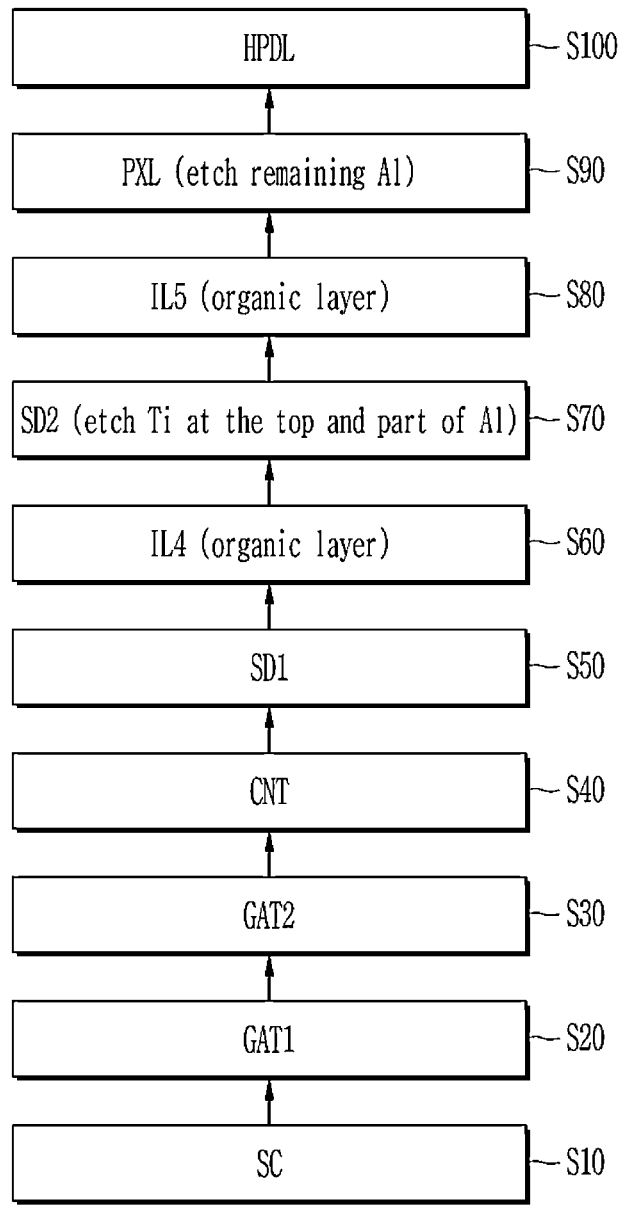
FIG. 9 illustrates a schematic flowchart of a process for manufacturing a display panel according to an embodiment.
Figure 10A:
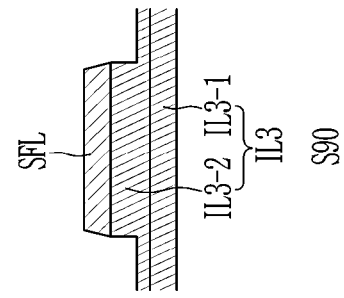
FIGS. 10A to 10D sequentially illustrate formation of a sacrificial layer in a process for manufacturing a display panel according to an embodiment.
Figure 10B:
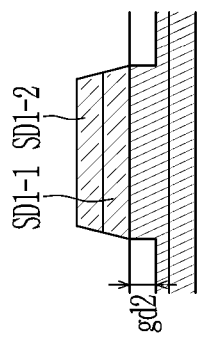
Figure 10C:
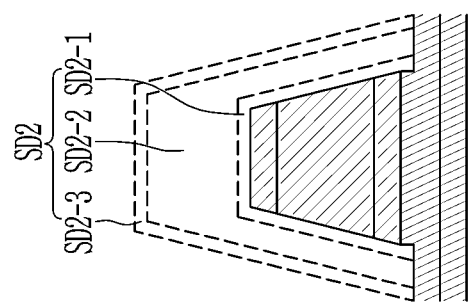
Figure 10D:
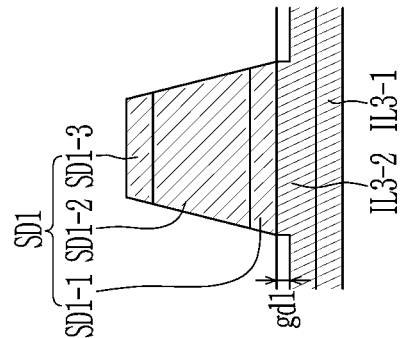
Figures 11A, 11B:
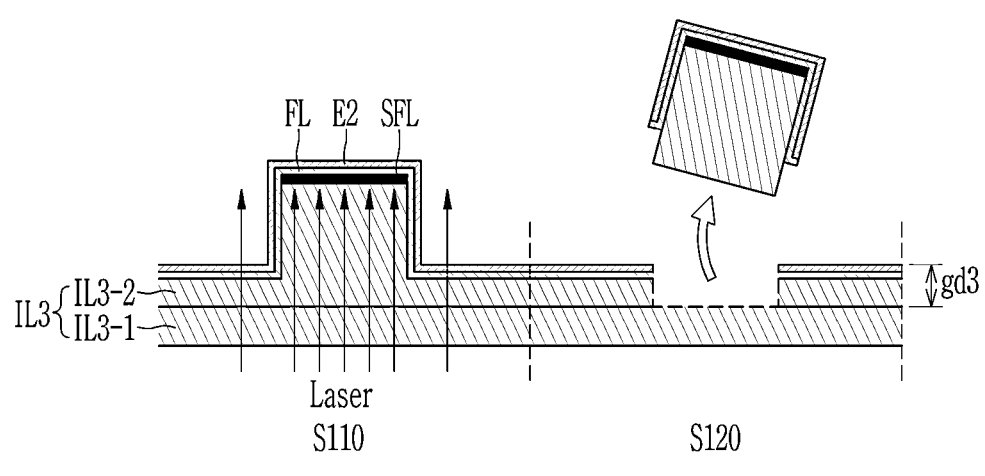
FIGS. 11A and 11B illustrate removal of a sacrificial layer and a peripheral layer by irradiating laser beams in a process for manufacturing a display panel according to an embodiment.

FIG. 9 illustrates a flowchart of a process for manufacturing a display panel according to an embodiment, FIGS. 10A to 10D sequentially illustrates formation of a sacrificial layer in a process for manufacturing a display panel according to an embodiment, and FIGS. 11A and 11B illustrate removal of a sacrificial layer and a peripheral layer by laser beams emitted thereat in a process for manufacturing a display panel according to an embodiment.

A stacking structure of the peripheral area LA will now be described with the focus on stacking of respective layers of the display area DA of the display panel with reference to FIG. 9. Respective stages S10 to S100 shown in FIG. 9 correspond to a process for performing etching by use of a mask, which will be described with reference to FIG. 6.

A buffer layer BF is formed on a substrate SUB, a material for a semiconductor layer is stacked, and an etching is performed by using a mask to complete (or form) a semiconductor layer SC (S10). In an embodiment, the semiconductor layer SC may be made of a polycrystalline semiconductor including polysilicon, and the final semiconductor layer SC may be formed by forming amorphous silicon, changing the same into polysilicon by a crystallization process, and patterning the same with a mask.

A first insulating layer IL1 is formed on the buffer layer BF and the semiconductor layer SC, a material for a first gate conductive layer is stacked, it is etched by using a mask, and a first gate conductive layer GAT1 including a gate electrode GE and a first capacitor electrode CE1 is completed (S20).

A second insulating layer IL2 is formed on the first insulating layer IL1 and the first gate conductive layer GAT1, a material for a second gate conductive layer is stacked, and the same is etched by using a mask to complete a second gate conductive layer GAT2 including a second capacitor electrode CE2 (S30).

A third insulating layer IL3 is formed on the second insulating layer IL2 and the second gate conductive layer GAT2, and an opening CNT for exposing the semiconductor layer SC is formed in the first insulating layer IL1, the second insulating layer IL2, and the third insulating layer IL3 by using a mask (S40).

A material for a first data conductive layer is stacked on the third insulating layer IL3, and the same is etched by using a mask to thus complete a first data conductive layer SD1 including a source electrode SE and a drain electrode DE (S50). In this instance, a pattern of the first data conductive layer SD1 is formed in the first peripheral area LA1, and the sacrificial layer SFL is completed by a subsequent process. A stage for manufacturing a sacrificial layer SFL will be described with reference to FIGS. 10A to 10D.

A first organic insulating layer IL4 is formed on the third insulating layer IL3 and the first data conductive layer SD1, and an opening of the display area DA and a pattern of the first organic insulating layer IL4 of the peripheral area LA are formed by using a mask (S60). The pattern of the first organic insulating layer IL4 of the peripheral area LA includes a 2-1-th sub-dam D2-*a*, and the pattern of the first organic insulating layer IL4 may not be formed in the other peripheral area LA.

A material for a second data conductive layer is stacked on the first organic insulating layer IL4, and the same is etched by using a mask to thus complete a second data conductive layer SD2 including a connecting member CE (S70).

A second organic insulating layer IL5 is formed on the first organic insulating layer IL4 and the second data conductive layer SD2, and an opening of the display area DA and a pattern of the second organic insulating layer IL5 of the peripheral area LA are formed by using a mask (S80). The pattern of the second organic insulating layer IL5 of the peripheral area LA includes a 1-1-th sub-dam D1-*a* and a 2-2-th sub-dam D2-*b*, and the pattern of the second organic insulating layer IL5 may not be formed in the other peripheral area LA.

A material for a pixel electrode layer is stacked on the second organic insulating layer IL5, and the same is etched by using a mask to complete a pixel electrode layer PXL including a first electrode E1 (S90).

Materials for forming a pixel defining layer IL6 and a spacer IL7 on the second organic insulating layer IL5 and the pixel electrode layer PXL are sequentially stacked, and a pixel defining layer IL6 and a pattern of a spacer IL7 of the peripheral area LA are formed in the display area DA together with an opening overlapping at least part of the first electrode E1 and defining a light emitting region by using a half-tone mask (S100). In FIG. 9, the word of "HPDL" is a shortened expression of the "Half-tone Pixel Defining Layer", which means that the pixel defining layer (PDL) IL6 is formed with a half-tone mask, and so the spacer is also formed in the same process as the pixel defining layer. The pixel defining layer IL6 and the pattern of the spacer IL7 include a 1-2-th sub-dam D1-*b*, a 1-3-th sub-dam D1-*c*, a 2-3-th sub-dam D2-*c*, and a 2-4-th sub-dam D2-*d*, and the pixel defining layer IL6 and the pattern of the spacer IL7 may not be formed in the other peripheral area LA.

An intermediate layer EL and a second electrode E2 are sequentially stacked on the pixel defining layer IL6 and the spacer IL7. The emission layer EML of the intermediate layer EL is formed in the opening of the pixel defining layer IL6, and the functional layer FL is formed on the substrate. As a result, the functional layer FL and the second electrode E2 are formed in the peripheral area LA, and as shown in FIGS. 11A and 11B, the functional layer FL and the second electrode E2 are disconnected in the first open region R1, the second open region R2, and the third open region R3 by irradiation of laser beams (S120).

Before the irradiation of laser beams is described, completion of a sacrificial layer SFL in the first peripheral area LA1 will now be described through S50 to S90 with reference to FIGS. 10A to 10D. A portion shown in FIGS. 10A to 10D corresponds to one of the first open region R1, the second open region R2, and the third open region R3.

FIG. 10A illustrates a third insulating layer IL3 with a double-layer structure including a 3-1-th inorganic insulating layer IL3-1 made of a silicon oxide ($SiO_x$) and a 3-2-th inorganic insulating layer IL3-2 made of a silicon nitride ($SiN_x$) positioned thereon.

A pattern of the first data conductive layer SD1 with a same material as the first data conductive layer SD1 is formed on the third insulating layer IL3 of the first peripheral area LA1 in S50 as shown in FIG. 10A. The pattern of the first data conductive layer SD1 has a triple-layer structure and includes a 1-1-th data conductive layer SD1-1, a 1-2-th data conductive layer SD1-2, and a 1-3-th data conductive layer SD1-3. In an embodiment, the 1-1-th data conductive layer SD1-1 and the 1-3-th data conductive layer SD1-3 include titanium (Ti), and the 1-2-th data conductive layer SD1-2 has a triple-layer structure including aluminum (Al).

Referring to FIG. 10A, while performing dry etching so as to form the pattern of the first data conductive layer SD1, the third insulating layer IL3 positioned below the pattern of the first data conductive layer SD1 is partly etched, and a thickness of the third insulating layer IL3 is reduced by gd1. Here, a value of gd1 may be about 50 nm to about 90 nm. The etched third insulating layer IL3 is a 3-2-th inorganic insulating layer IL3-2 made of a silicon nitride ($SiN_x$), and the 3-1-th inorganic insulating layer IL3-1 made of a silicon oxide ($SiO_x$) is not etched.

The first organic insulating layer IL4 is formed in the display area DA through S60, and the first organic insulating layer IL4 is stacked, is removed, and is not formed in the open regions R1, R2, and R3 in the peripheral area LA.

The completion (S70) of a second data conductive layer SD2 will be divided into two stages (S70-1 and S70-2) in FIGS. 10B and 10C for a clearer description. As shown in FIGS. 10B and 10C, the completion (S70) of a second data conductive layer SD2 includes stacking a material for a second data conductive layer SD2 (S70-1) and etching the material for a second data conductive layer SD2 (S70-2).

As shown in FIG. 10B, a material for a second data conductive layer SD2 is stacked on the pattern of the triple-layer first data conductive layer SD1 positioned in the open regions R1, R2, and R3 (S70-1). The material for a second data conductive layer SD2 has a triple-layer including a 2-1-th data conductive layer SD2-1, a 2-2-th data conductive layer SD2-2, and a 2-3-th data conductive layer SD2-3. In an embodiment, the 2-1-th data conductive layer SD2-1 and the 2-3-th data conductive layer SD2-3 include titanium (Ti), and the 2-2-th data conductive layer SD2-2 has a triple-layer structure including aluminum (Al), thereby having a same triple-layer structure as the first data conductive layer SD1.

As shown in FIG. 10C, a process for etching a material for a second data conductive layer SD2 in the display area DA is performed (S70-2). In this instance, the materials for a second data conductive layer SD2 positioned in the open regions R1, R2, and R3 are dry etched. In the open regions R1, R2, and R3, the stacked materials for a second data conductive layer SD2 are dry etched, the 1-3-th data conductive layer SD1-3 positioned at the top portion of the pattern of the triple-layer first data conductive layer SD1 position therebelow is removed, and a thickness of the 1-2-th data conductive layer SD1-2 is reduced. The third insulating layer IL3 exposed by the dry etching is additionally partly etched, and the thickness thereof is reduced by gd2. Here, a value of gd2 may be about 100 nm to about 180 nm. The etched third insulating layer IL3 is a 3-2-th inorganic insulating layer IL3-2 made of a silicon nitride ($SiN_x$), and the 3-1-th inorganic insulating layer IL3-1 made of a silicon oxide ($SiO_x$) is not etched.

The second organic insulating layer IL5 is formed in the display area DA through S80, and the second organic insulating layer IL5 is stacked, is removed, and is not formed in the open regions R1, R2, and R3 in the peripheral area LA.

As shown in FIG. 10D, in case that a material for a pixel electrode layer PXL is stacked in the display area DA, and the same is wet etched to complete a pixel electrode layer PXL including a first electrode E1 (S90), and in case that the material for a pixel electrode layer PXL is stacked, is wet etched, and is removed in the open regions R1, R2, and R3 in the peripheral area LA, the 1-2-th data conductive layer SD1-2, of which the thickness is reduced and which remains, of the pattern of the first data conductive layer SD1 is etched, and the final sacrificial layer SFL is completed. The sacrificial layer SFL and the 1-1-th data conductive layer SD1-1 of the pattern of the first data conductive layer SD1 are disposed in a same layer and the sacrificial layer includes titanium (Ti). The sacrificial layer SFL is also referred to as a dummy metal pattern, it is not electrically connected to other constituent elements so it floats, and it may have a shape (e.g., a ring shape) corresponding to a dam shape in a plan view.

A thickness of the third insulating layer IL3 exposed in case that the sacrificial layer SFL is completed in FIG. 10D may be equivalent to the case of FIG. 10C, and the final thickness of the third insulating layer IL3 may have a value generated by subtracting a thickness of equal to or less than about 180 nm from the thickness of the initially formed third insulating layer IL3. The thickness of about 100 nm to 180 nm of the 3-2-th inorganic insulating layer IL3-2 remaining in the first peripheral area LA1 is reduced, and it may have a thickness of about 20 nm to about 100 nm. The 3-1-th inorganic insulating layer IL3-1 at the bottom of the third insulating layer IL3 is not etched, so its thickness is constant in the display area DA and the peripheral area LA.

Removing part of the functional layer FL and the second electrode E2 by using the sacrificial layer SFL completed in the open regions R1, R2, and R3 of the peripheral area LA will now be described in detail with reference to FIGS. 11A and 11B.

Stage S100 of FIG. 9 is performed on the sacrificial layer SFL that is completed as shown in FIG. 10D. For example, materials for forming the pixel defining layer IL6 and the spacer IL7 are sequentially stacked on the sacrificial layer SFL, are etched, and are then removed.

The functional layer FL and the second electrode E2 are sequentially stacked, so that the functional layer FL and the second electrode E2 are formed on the sacrificial layer SFL.

While formed in this way, as shown in FIG. 11A, laser beams are irradiated under the substrate SUB (S110). The laser beams are applied to a predetermined region (the first peripheral area LA1) in the peripheral area LA. The laser beams irradiated as shown in FIG. 11B react with the sacrificial layer SFL made of a metal, and the sacrificial layer SFL and a peripheral layer peel off. In this instance, the functional layer FL and the second electrode E2 peel off together with the sacrificial layer SFL and have a separated structure with respect to the open regions R1, R2, and R3. As the sacrificial layer SFL peels off, part of the third insulating layer IL3 positioned therebelow also peels off. In case that the third insulating layer IL3 has a double-layer structure, the 3-2-th inorganic insulating layer IL3-2 at the top thereof may peel off in case that the sacrificial layer SFL peels off. This may mean that the same peels off from an interface between a silicon nitride ($SiN_x$) and a silicon oxide ($SiO_x$). As a result, as shown in FIG. 11B, the 3-1-th inorganic insulating layer IL3-1 made of a silicon oxide ($SiO_x$) may remain in the open regions R1, R2, and R3, and the 3-2-th inorganic insulating layer IL3-2 made of a silicon nitride ($SiN_x$) may be removed.

Referring to FIGS. 11A and 11B, the open regions R1, R2, and R3 are formed to be as low as the thickness of the 3-2-th inorganic insulating layer IL3-2, the functional layer FL, and the second electrode E2, compared to the adjacent first peripheral area LA1. A thickness difference gd3 between the open regions R1, R2, and R3 and the adjacent first peripheral area LA1 may be about 300 nm to about 500 nm.

As the irradiated laser beams react with the metal, they must not be irradiated to the display area DA, and they may not be irradiated to the second peripheral area LA2 because of the roundabout portion RDL. The laser beams are irradiated corresponding to sacrificial layers SFL in the first peripheral area LA1, and they may also be irradiated to the dams D1 and D2.

The sacrificial layer SFL needs to have equal to or greater than a predetermined thickness so as to react to the laser beams, and in case that it is made of titanium Ti, the sacrificial layer SFL may have a thickness of equal to or greater than about 20 nm.

Depending on embodiments, laser beams with different energy densities (ED) may be irradiated to the region to which the laser beams are irradiated. For example, the laser beams with high energy density may be irradiated to the region in which the sacrificial layer SFL is positioned, and laser beams with low energy density may be irradiated to other regions. The laser beams may be irradiated in a direction that faces a region in which an opening area DTA will be formed from the display area DA. In case that the energy density of the laser beams is high, a peripheral insulating layer may be carbonized, so the laser beams may be irradiated with the energy density of equal to or less than about 1,000 $mJ/cm^2$.

FIGS. 10A to 10D and 11A and 11B mainly illustrate and describe a sacrificial layer SFL, and a sacrificial layer SFL forms an opening area in the first peripheral area LA1, so it is found that a total of three sacrificial layers SFL are formed and removed and a total of three open regions R1, R2, and R3 are formed according to an embodiment described with reference to FIG. 7. The sacrificial layer SFL and the open regions R1, R2, and R3 do not overlap the dams D1 and D2, and may be positioned between the dams D1 and D2.

After the process shown in FIGS. 11A and 11B is performed, referring to FIG. 7, a first encapsulation inorganic layer EIL1 may be formed on the front side of the substrate SUB. The encapsulation organic layer EOL may overlap the display area DA and may be positioned on part of the peripheral area LA. In a process for forming an encapsulation organic layer EOL, a liquefied organic material may be prevented from being spread by the dams D1 and D2. The encapsulation organic layer EOL may be formed by an inkjet method for applying a liquefied organic material to the first encapsulation inorganic layer EIL1. In this instance, the dams D1 and D2 define a boundary of the region to which the liquefied organic material is applied, and prevent the liquefied organic material from overflowing into the outsides of the dams D1 and D2.

A second encapsulation inorganic layer EIL2 may be formed on the encapsulation organic layer EOL to overlap the front side of the substrate SUB. The first encapsulation inorganic layer EIL1 and the second encapsulation inorganic layer EIL2 may contact each other in the peripheral area LA.

An additional overcoat layer YOC and an additional inorganic insulating layer YILD may be sequentially stacked on the second encapsulation inorganic layer EIL2 and in part of the display area DA and in the peripheral area LA. An additional planarization layer YPVX may be further stacked on the entire display panel. Depending on embodiments, a touch electrode for sensing a touch may be additionally formed between the encapsulation layer ENC and the additional planarization layer YPVX in the display area DA.

In case that the display panel is completed as described above, a process for forming an opening area DTA for disposing a first electronic module ES1 such as a camera is performed. The opening area DTA may be formed to penetrate through the display panel. The opening area DTA may be formed by laser beams or a drilling process.

A planar structure and a cross-sectional structure of the peripheral area LA will be described with reference to FIGS. 12 to 15.

The planar structure of the peripheral area LA will now be described with reference to FIGS. 12 and 13.

Figure 12:
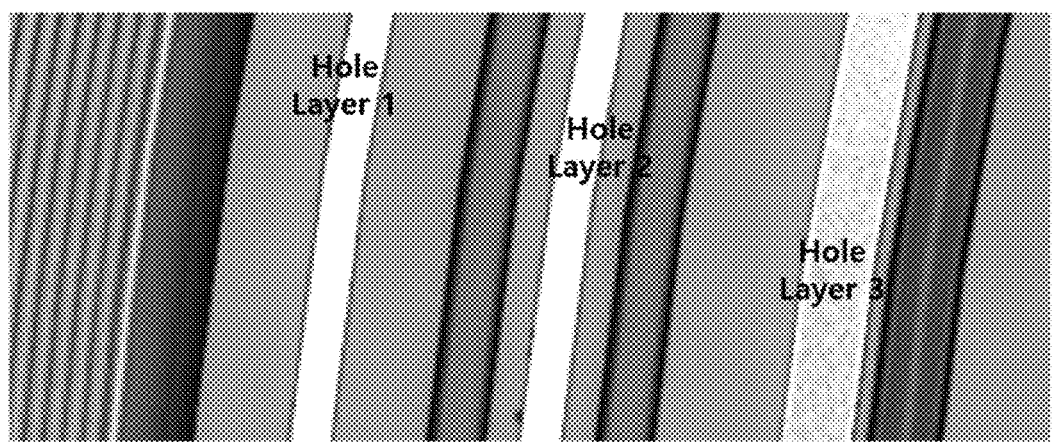
FIG. 12 illustrates a photograph of a sacrificial layer and a peripheral region before laser beams are irradiated on a display panel according to an embodiment.
Figure 13:
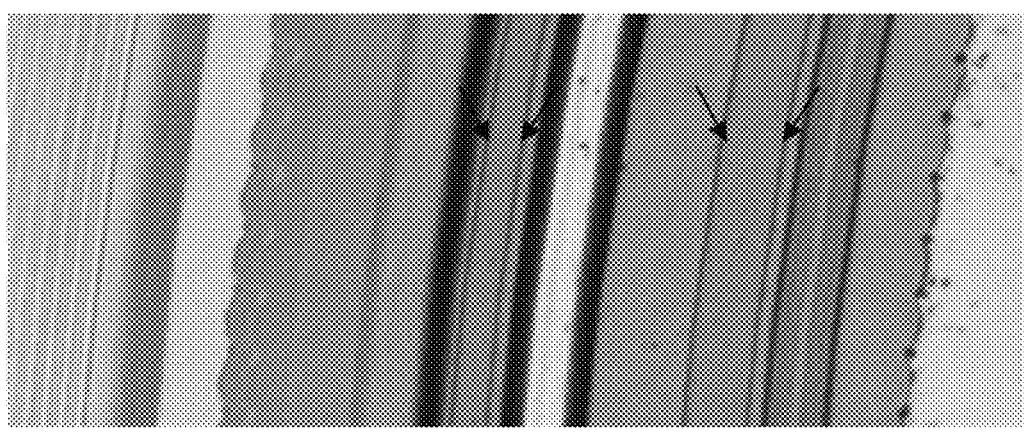
FIG. 13 illustrates a photograph taken after a sacrificial layer and a peripheral layer are removed by irradiating laser beams on a display panel according to an embodiment.

FIG. 12 illustrates a photograph of a sacrificial layer and a peripheral region before laser beams are irradiated in a display panel according to an embodiment, and FIG. 13 illustrates a photograph taken after a sacrificial layer and a peripheral layer are removed by irradiating laser beams in a display panel according to an embodiment.

Regions marked with Hole layer 1, Hole layer 2, and Hole layer 3 in FIG. 12 are sacrificial layers SFL, and it is found that they are made of metal materials and accordingly display bright colors.

FIG. 13 illustrates a state after the sacrificial layer SFL and its peripheral layer are removed by irradiating the laser beams.

Referring to FIG. 13, it is found that dark lines (refer to arrows of FIG. 13) are visible at the portions from which the sacrificial layer SFL is removed. It is found in FIG. 13 that distinct dark lines are positioned on the Hole layer 2 and the Hole layer 3 while the dark line is not clear on the Hole layer 1 of FIG. 12. The dark lines may be visible because of a height difference or a step (or thickness difference) between the open regions R1, R2, and R3 and the adjacent first peripheral area LA1, and may also be visible in case that the peripheral portion undergoes a reaction by irradiation of laser beams.

The step between the open regions R1, R2, and R3 and the adjacent first peripheral area LA1 will now be described with reference to FIGS. 14 and 15.

Figure 14:
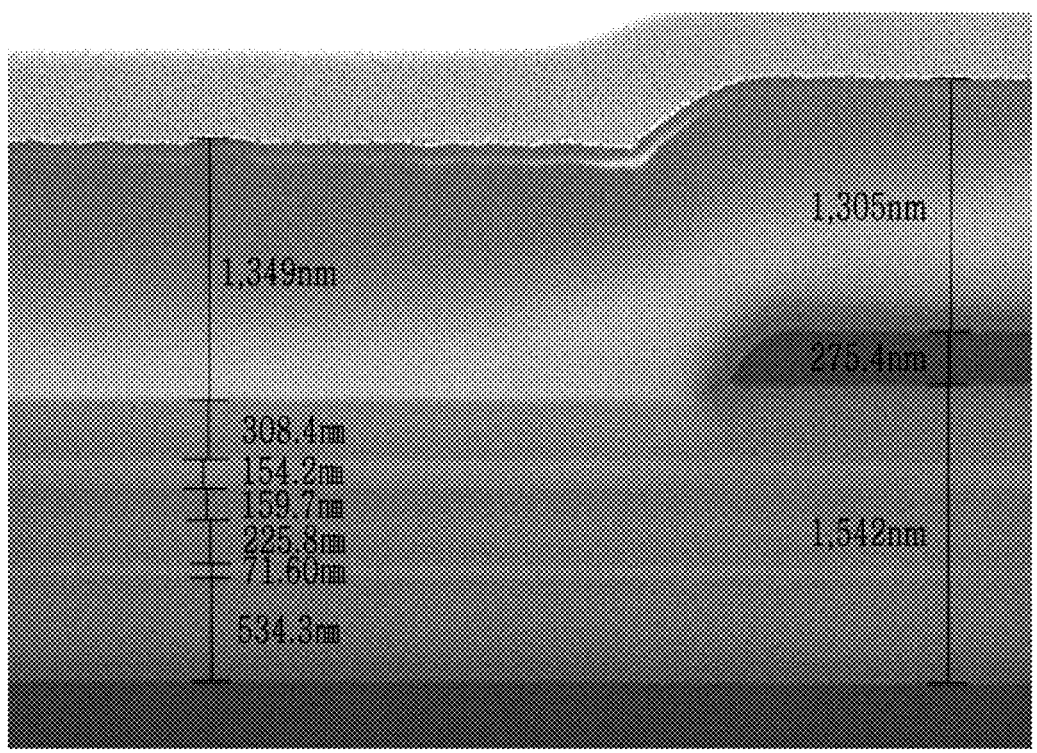
FIG. 14 illustrates a schematic cross-section of a sacrificial layer that is removed and when a display panel is completed and a peripheral region thereof according to an embodiment.
Figure 15:
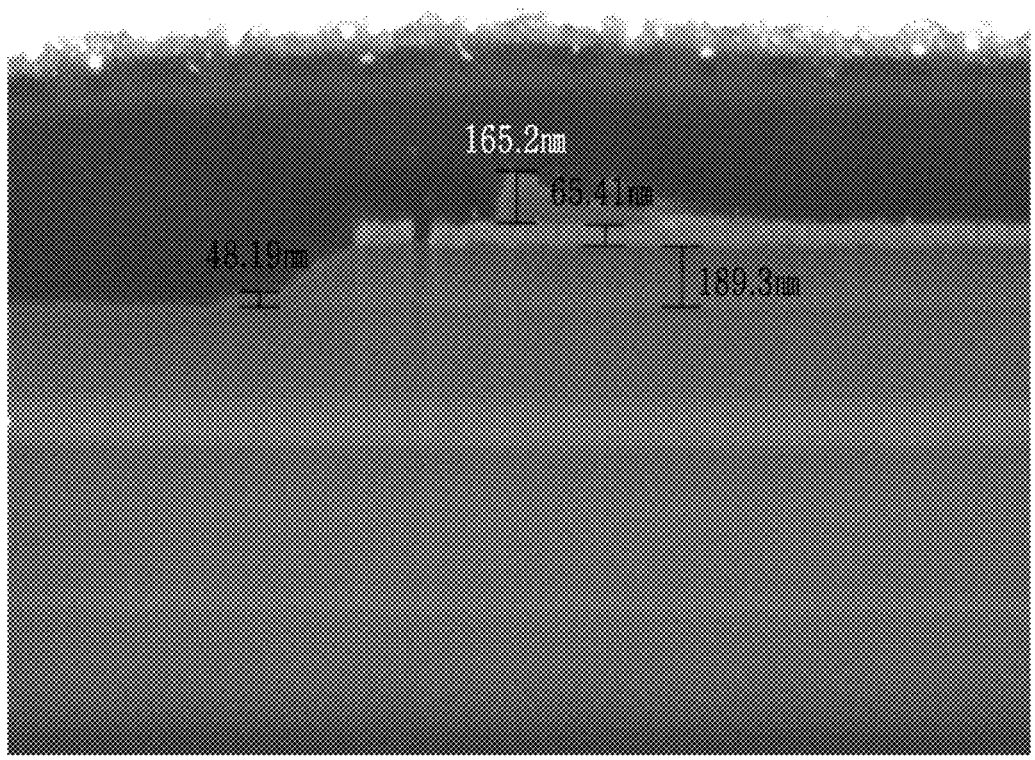
FIG. 15 illustrates a photographed cross-section of a peripheral region before a sacrificial layer is completed while a display panel according to an embodiment is manufactured.

FIG. 14 illustrates a photographed cross-section of a sacrificial layer that is removed in case that a display panel is completed and a peripheral region thereof according to an embodiment, and FIG. 15 illustrates a photographed cross-section of a peripheral region before a sacrificial layer is completed while a display panel according to an embodiment is manufactured.

A thickness relationship of layers after the sacrificial layer is removed by irradiating laser beams will now be described with reference to FIG. 14.

FIG. 14 illustrates a portion on which a functional layer FL and a second electrode E2 are positioned and a portion on which the functional layer FL and the second electrode E2 are not positioned, and the portion on which the functional layer FL and the second electrode E2 are not positioned corresponds to the open regions R1, R2, and R3.

Referring to FIG. 14, a summation of measured thicknesses of the respective layers SUB, BF, IL1, IL2, and IL3-1 of the open regions R1, R2, and R3 is about 1,454 nm (i.e., 534.3+71.6+225.8+159.7+154.2+308.4=1,454).

A total thickness to the 3-2-th inorganic insulating layer IL3-2 positioned below the functional layer FL is measured to be about 1,542 nm.

Based on this, the thickness of the 3-2-th inorganic insulating layer IL3-2 is about 88 nm, and the thickness of gd3 shown in FIG. 11B is about 363.4 nm. Therefore, a height difference between the open regions R1, R2, and R3 and their peripheral portion in the first peripheral area LA1 on the finally completed display panel according to an embodiment is about 363.4 nm, and a thickness difference (or height difference) of about 300 nm to about 500 nm may occur depending on embodiments. For example, a thickness difference between the open region R1 and the second peripheral area LA2 adjacent to the display area is about 300 nm to about 500 nm. The thickness of the 3-2-th inorganic insulating layer IL3-2 remaining in the first peripheral area LA1 may be about 20 nm to about 100 nm.

A cross-section of a peripheral portion before a corresponding sacrificial layer is completed will now be described with reference to FIG. 15. FIG. 15 illustrates a photograph of a cross-sectional structure in FIG. 10D, illustrating a state in which part of the 1-2-th data conductive layer SD1-2 including aluminum (Al) remains by wet etching. However, the same will be removed with the sacrificial layer by a subsequent laser process, so it is not a problem that part of the 1-2-th data conductive layer SD1-2 remains.

Referring to FIG. 15, the 1-1-th data conductive layer SD1-1 configuring the sacrificial layer SFL has a thickness of about 65.41 nm, the 3-2-th inorganic insulating layer IL3-2 positioned below the 1-1-th data conductive layer SD1-1 has a thickness of about 189.3 nm, and the exposed 3-2-th inorganic insulating layer IL3-2 is measured to have the thickness of about 48.19 nm. In this case, the gd2 in FIG. 10C has a value of about 141.11 nm.

In case that the functional layer FL and the second electrode E2 are stacked on the exposed 3-2-th inorganic insulating layer IL3-2, it has a layered structure as shown in FIG. 11A.

The display panel in which the sacrificial layer SFL is formed and is removed by irradiating laser beams according to an embodiment has been described.

For a comparison according to structures and methods, FIGS. 16A to 16E and 17 illustrate a manufacturing method and a layered structured according to a comparative example.

Formation of a sacrificial layer according to a comparative example will now be described with reference to FIGS. 16A to 16E.

FIGS. 16A to 16E sequentially illustrate formation of a sacrificial layer of a display panel according to a comparative example.

FIGS. 16A to 16E do not illustrate a structure below the third insulating layer IL3.

The third insulating layer IL3 in FIGS. 16A to 16E is shown to have a double-layer structure including a 3-1-th inorganic insulating layer IL3-1 made of a silicon oxide ($SiO_x$) and a 3-2-th inorganic insulating layer IL3-2 made of a silicon nitride ($SiN_x$) positioned thereon.

Figure 16:
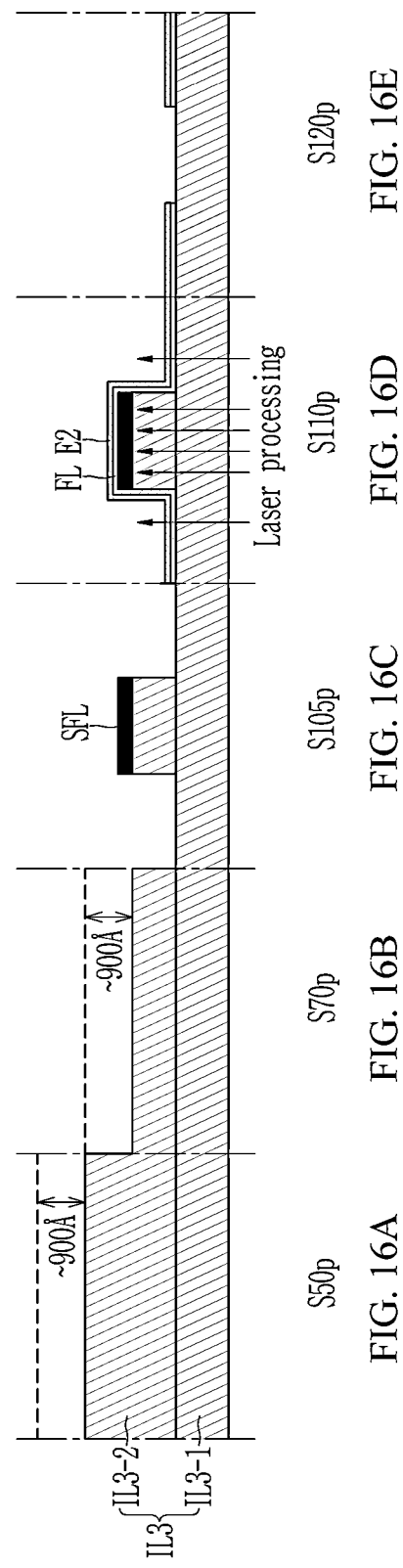
FIGS. 16A to 16E sequentially illustrate formation of a sacrificial layer of a display panel according to a comparative example.

As illustrated in FIG. 16A, a material for a first data conductive layer is stacked on the third insulating layer IL3 in the display area DA, and is etched by use of a mask to complete a first data conductive layer SD1 including a source electrode SE and a drain electrode DE by S50$p$ that corresponds to S50 of FIG. 9. In the comparative example, the pattern of the first data conductive layer SD1 is not formed in the peripheral area LA. As a result, the material for a first data conductive layer is etched, the 3-2-th inorganic insulating layer IL3-2 positioned therebelow is dry etched, and the height is reduced by equal to or less than about 90 nm.

A first organic insulating layer IL4 is stacked on the 3-2-th inorganic insulating layer IL3-2 at the portion on which the sacrificial layer SFL is formed in the peripheral area LA, and is etched and removed.

As illustrated in FIG. 16B, a material for a second data conductive layer is stacked in the display area DA through S70$p$ that corresponds to S70 of FIG. 9, and is etched to complete the second data conductive layer SD2. The pattern of the second data conductive layer SD2 is not formed in the peripheral area LA according to a comparative example. As a result, the material for a second data conductive layer is etched, the 3-2-th inorganic insulating layer IL3-2 positioned therebelow is additionally dry etched, and the height is further reduced by equal to or less than about 90 nm.

Processes from S80 to S100 of FIG. 9 are performed in a comparative example. As shown in FIG. 16C, the sacrificial layer SFL is formed by using an additional mask (S105$p$). For example, a metal material for a sacrificial layer is stacked in the peripheral area LA, and is etched by using a mask to complete the sacrificial layer SFL. As shown in FIG. 16C, the 3-2-th inorganic insulating layer IL3-2 is entirely etched, and the 3-1-th inorganic insulating layer IL3-1 is exposed.

The functional layer FL and the second electrode E2 are sequentially stacked, and as shown in FIG. 16D, the laser beams are irradiated under the substrate SUB (S110$p$). The irradiated laser beams react with the sacrificial layer SFL made of a metal so that the sacrificial layer SFL and the peripheral layer may peel off.

As a result, the comparative example has a final cross-sectional structure in S120$p$ shown in FIG. 16E.

When a cross-sectional structure of FIG. 16E according to a comparative example is compared to a cross-sectional structure of FIG. 11B according to the embodiment, the cross-sectional structures of the open regions R1, R2, and R3 from which the sacrificial layer SFL peels off are the same, but the difference is that the 3-2-th inorganic insulating layer IL3-2 may or may not be positioned around the same.

A cross-section of the actually manufactured comparative example by the manufacturing method of FIGS. 16A to 16E will now be described with reference to FIG. 17.

Figure 17:
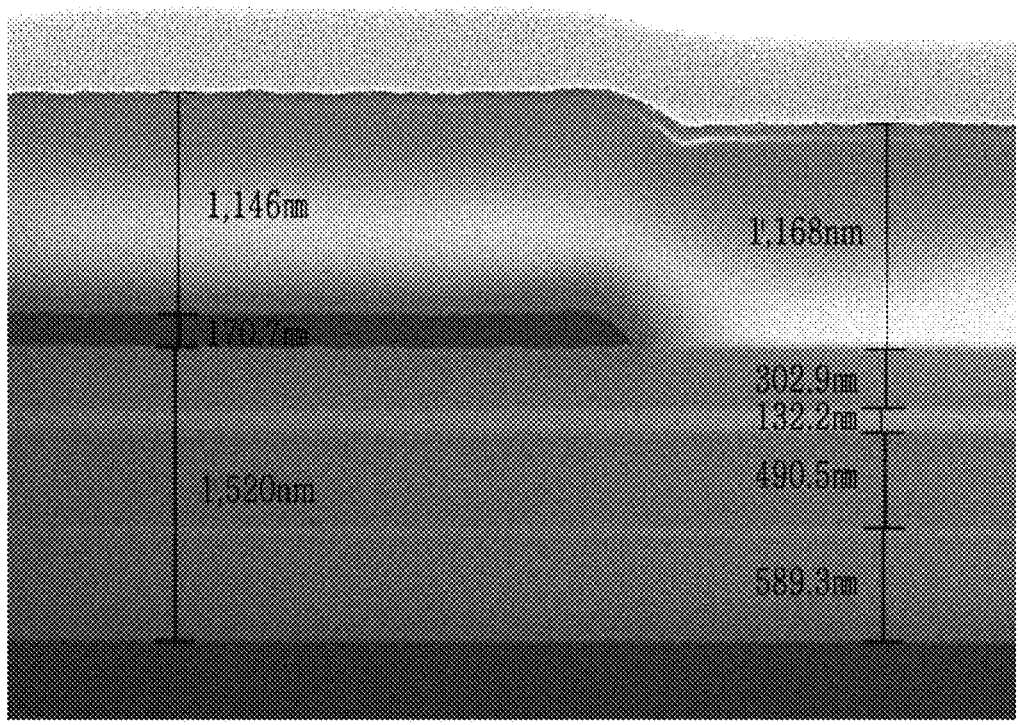
FIG. 17 illustrates a photograph of cross-section of a sacrificial layer that is removed when a display panel is completed and a peripheral region thereof according to a comparative example of FIGS. 16A to 16E.

FIG. 17 illustrates a photograph of a cross-section of a sacrificial layer that is removed in case that a display panel is completed, and a peripheral region thereof, according to the comparative example of FIGS. 16A to 16E.

FIG. 17 illustrates a portion on which a functional layer FL and a second electrode E2 are positioned and a portion on which the functional layer FL and the second electrode E2 are not positioned, and the portion on which the functional layer FL and the second electrode E2 are not positioned corresponds to opening areas.

Referring to FIG. 17, a total thickness below the functional layer FL is about 1,520 nm, and a total thickness of the opening area in which the functional layer FL is not positioned is about 1514.9 nm (e.g., 589.3+490.5+132.2+302.9=1514.9). In case that the two thicknesses are compared, there is a difference of about 5 nm, which is however substantially the same height when a measurement error and a processing error are considered.

Referring to FIG. 17, the 3-2-th inorganic insulating layer IL3-2 is not visible at the bottom of the functional layer FL, but the 3-1-th inorganic insulating layer IL3-1 is constantly positioned, so that in case that compared to the structure according to an embodiment, it is found that there is a difference in the heights of the functional layer FL and the second electrode E2. For example, the 3-2-th inorganic insulating layer IL3-2 is not formed around the opening area in a comparative example, and the 3-2-th inorganic insulating layer IL3-2 of which the thickness is reduced is positioned around the open regions R1, R2, and R3 in the embodiment of FIG. 11B. The thickness of the 3-2-th inorganic insulating layer IL3-2 having a reduced height may be about 20 nm to about 100 nm. As a result, in an embodiment, compared to the comparative example, a depth of a portion where the functional layer FL and the second electrode E2 are short-circuited is greater by the thickness (about 20 nm to about 100 nm) of the 3-2-th inorganic insulating layer IL3-2, and the functional layer FL and the second electrode E2 are positioned to be distant from the substrate SUB by the thickness (about 20 nm to about 100 nm) of the 3-2-th inorganic insulating layer IL3-2.

An embodiment will now be described with reference to FIGS. 18 to 21.

The other embodiment represents a semiconductor layer included in the pixel PX that includes an oxide semiconductor layer in addition to a polycrystalline semiconductor layer.

A circuit configuration of a pixel PX according to another embodiment will now be described with reference to FIG. 18.

Figure 18:
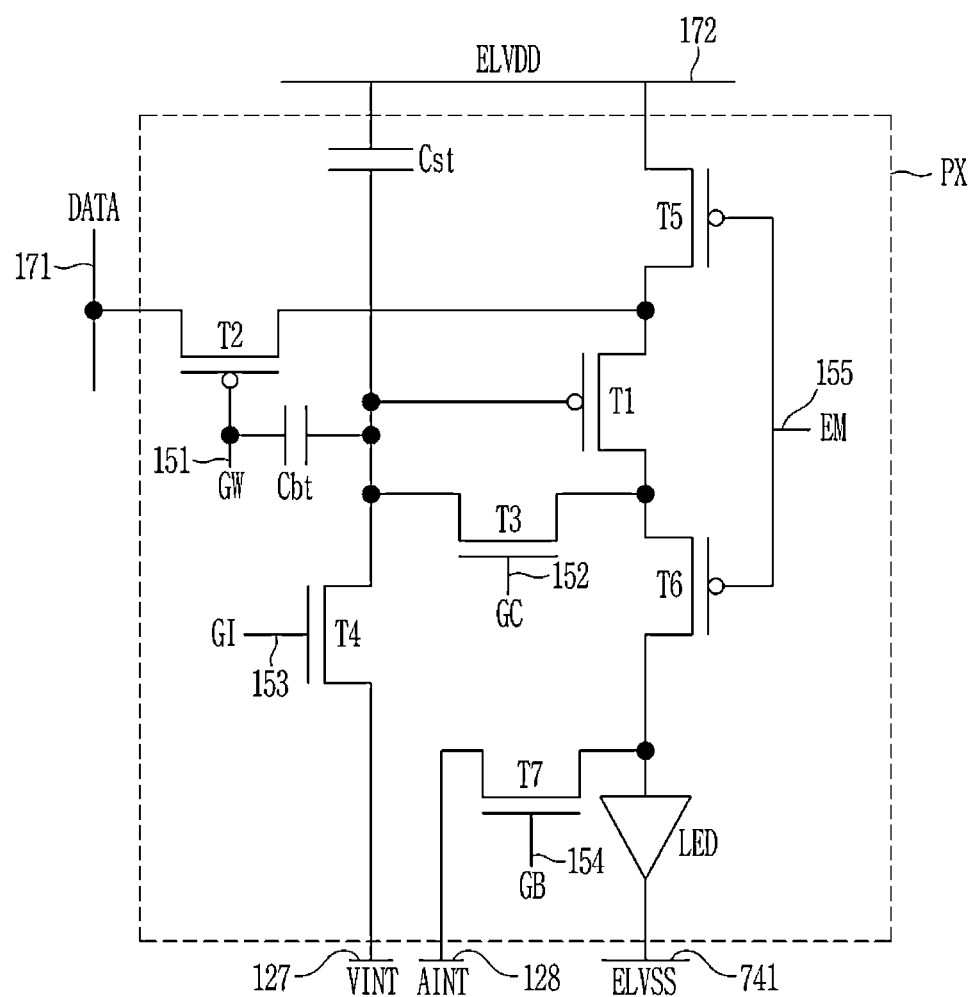
FIG. 18 illustrates a schematic circuit diagram of a pixel according to another embodiment.

FIG. 18 illustrates a schematic circuit diagram of a pixel according to an embodiment.

Regarding the pixel PX shown in FIG. 18, unlike the pixel (PX) shown in FIG. 5, the third transistor T3, the fourth transistor T4, and the seventh transistor T7 include oxide semiconductors. As a result, the second transistor T2 and the third transistor T3 receive different scan signals GW and GC. In an embodiment described with reference to FIG. 18, the fourth transistor T4 and the seventh transistor T7 receive different initialization voltages VINT and AINT.

As shown in FIG. 18, a pixel PX of the display device according to an embodiment includes transistors T1, T2, T3, T4, T5, T6, and T7 electrically connected to wires 127, 128, 151, 152, 153, 154, 155, 171, 172, and 741, a storage capacitor Cst, a boost capacitor Cbt, and a light emitting diode LED.

The wires (127, 128, 151, 152, 153, 154, 155, 171, 172, and 741) are electrically connected to a pixel PX. The wires include a first initialization voltage line 127, a second initialization voltage line 128, a first scan signal line 151, a second scan signal line 152, an initialization control line 153, a bypass control line 154, an emission control line 155, a data line 171, a driving voltage line 172, and a common voltage line 741.

The first scan signal line 151 is electrically connected to a scan driver and transmits a first scan signal GW to the second transistor T2. The second scan signal line 152 may apply a voltage with a polarity that is opposite to a polarity of a voltage applied to the first scan signal line 151 at the same timing as the signal of the first scan signal line 151. For example, in case that a voltage with a negative polarity is applied to the first scan signal line 151, a voltage with a positive polarity may be applied to the second scan signal line 152. The second scan signal line 152 transmits a second scan signal GC to the third transistor T3.

The initialization control line 153 transmits an initialization control signal GI to the fourth transistor T4. The bypass control line 154 transmits a bypass signal GB to the seventh transistor T7. The bypass control line 154 may be configured with a previous-stage first scan signal line 151. The emission control line 155 transmits an emission control signal EM to the fifth transistor T5 and the sixth transistor T6.

The data line 171 transmits a data voltage DATA generated by a data driver (not shown), and luminance of light emitted by a light emitting diode LED is changed according to the data voltage DATA applied to the pixel PX.

The driving voltage line 172 applies the driving voltage ELVDD. The first initialization voltage line 127 transmits a first initialization voltage VINT, and the second initialization voltage line 128 transmits a second initialization voltage AINT. The common voltage line 741 applies a common voltage ELVSS to a cathode of the light emitting diode LED. In an embodiment, respective constant voltages may be applied to the driving voltage line 172, the first and second initialization voltage lines 127 and 128, and the common voltage line 741.

The transistors may include a driving transistor T1, a second transistor T2, a third transistor T3, a fourth transistor T4, a fifth transistor T5, a sixth transistor T6, and a seventh transistor T7. The transistors may include oxide transistors including oxide semiconductors and silicon transistors including polycrystalline silicon semiconductors. In an embodiment described with reference to FIG. 18, the third transistor T3, the fourth transistor T4, and the seventh transistor T7 may be made of (or formed as) oxide transistors, and the driving transistor Ti, the second transistor T2, the fifth transistor T5, and the sixth transistor T6 may be made of silicon transistors. However, the disclosure is not limited thereto, and the transistors may all be made of silicon transistors and/or oxide transistors.

The second transistor T2 transmits the data voltage DATA to the pixel PX, the fourth transistor T4 initializes the voltage at the gate electrode of the driving transistor T1 to be the first initialization voltage VINT, and the seventh transistor T7 initializes the voltage of the anode of the light emitting diode LED to be the second initialization voltage AINT.

The fifth transistor T5 transmits the driving voltage ELVDD to the driving transistor T1, the sixth transistor T6 transmits an output current of the driving transistor T1 to the light emitting diode LED, and a section in which the fifth transistor T5 and the sixth transistor T6 are turned on may be an emission section.

The third transistor T3 electrically connects the gate electrode of the driving transistor Ti and an output-side electrode so that the data voltage DATA may pass through the driving transistor T1 and may be stored in the storage capacitor Cst electrically connected to the gate electrode of the driving transistor T1. In this instance, the voltage finally stored in the storage capacitor Cst may be a voltage value generated by compensating for a threshold voltage of the driving transistor T1.

The driving transistor T1 generates an output current based on the voltage stored in the storage capacitor Cst and outputs the same.

The boost capacitor Cbt reduces the voltage at the gate electrode of the driving transistor T1 in case that the first scan signal GW applied to the first scan signal line 151 is changed to a lower voltage and the second transistor T2 is turned on. As a result, the driving transistor T1 may maintain a turn-on state.

A pixel PX has been described to include seven transistors T1 to T7, one storage capacitor Cst, and one boost capacitor Cbt. However, the disclosure is not limited thereto, and the number of transistors, the number of capacitors, and their connection relationships are modifiable in many ways.

A process for manufacturing a display panel according to another embodiment will now be described with reference to FIG. 19.

Figure 19:
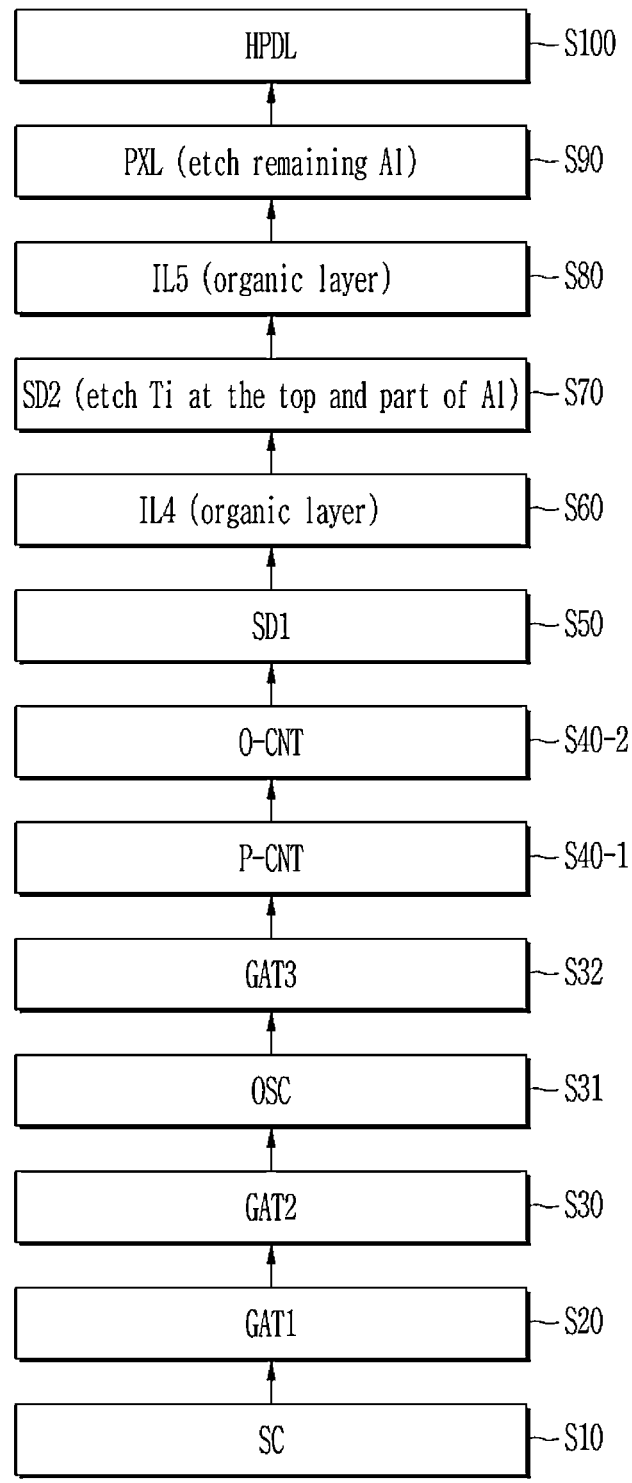
FIG. 19 illustrates a flowchart of a process for manufacturing a display panel according to another embodiment.

FIG. 19 illustrates a flowchart of a process for manufacturing a display panel according to another embodiment.

In comparison to the case of FIG. 9, the embodiment described with reference to FIG. 19 further includes forming an oxide semiconductor layer OSC (S31), and forming a third gate conductive layer GAT3 (S32). The embodiment described with reference to FIG. 9 includes two stages (S40-1, S40-2) of forming an opening.

The respective stages will now be described.

After a buffer layer BF is formed on the substrate SUB, a material for a semiconductor layer is stacked, and is etched by using a mask to complete a semiconductor layer SC (S10). In an embodiment, the semiconductor layer SC may be made of a polycrystalline semiconductor including polysilicon, and the final semiconductor layer SC may be formed by forming amorphous silicon, changing the same into polysilicon by a crystallization process, and patterning the same with a mask.

A first insulating layer IL1 is formed on the buffer layer BF and the semiconductor layer SC, a material for a first gate conductive layer is stacked, it is etched by using a mask, and a first gate conductive layer GAT1 including a gate electrode GE and a first capacitor electrode CE1 is completed (S20).

A second insulating layer IL2 is formed on the first insulating layer IL1 and the first gate conductive layer GAT1, a material for a second gate conductive layer is stacked, and the same is etched by using a mask to complete the second gate conductive layer GAT2 including a second capacitor electrode CE2 and an overlapping electrode OBML (S30).

A 2-1-th inorganic insulating layer IL2-1 is formed on the second insulating layer IL2 and the second gate conductive layer GAT2, and the oxide semiconductor layer OSC is completed by using a mask (S31).

A 2-2-th inorganic insulating layer IL2-2 for covering the 2-1-th inorganic insulating layer IL2-1 and the oxide semiconductor layer OSC is stacked. A material for a third gate conductive layer is stacked on the 2-2-th inorganic insulating layer IL2-2, and is etched by using a mask to complete the third gate conductive layer GAT3 including an oxide gate electrode OGE overlapping the oxide semiconductor layer OSC S32. Depending on embodiments, a connecting member electrically connected to the overlapping electrode OBML may be additionally formed on the third gate conductive layer GAT3.

A third insulating layer IL3 is formed on the 2-2-th inorganic insulating layer IL2-2 and the third gate conductive layer GAT3, and a first opening P-CNT for exposing the semiconductor layer SC to the first insulating layer IL1, the second insulating layer IL2, the 2-1-th inorganic insulating layerIL2-1, the 2-2-th inorganic insulating layerIL2-2, and the third insulating layer IL3 is formed by using a mask (S40-1). Here, the first opening P-CNT may expose the semiconductor layer SC made of a polycrystalline semiconductor.

A second opening O-CNT for exposing an oxide semiconductor layer OSC is formed on the 2-2-th inorganic insulating layer IL2-2 and the third insulating layer IL3 by using an additional mask (S40-2). Here, the second opening O-CNT may expose an oxide semiconductor layer OSC made of an oxide semiconductor. Depending on embodiments, a process for forming an opening may be performed with a mask, or the opening may be formed by one process, but the disclosure is not limited thereto.

A material for a first data conductive layer is stacked on the third insulating layer IL3, and it is etched by using a mask to thus complete a first data conductive layer SD1 including a source electrode SE and a drain electrode DE (S50). In this instance, a pattern of the first data conductive layer SD1 is formed in the first peripheral area LA1, and the sacrificial layer SFL is completed by a subsequent process (refer to FIGS. 10A to 10D).

A first organic insulating layer IL4 is formed on the third insulating layer IL3 and the first data conductive layer SD1, and an opening of the display area DA and a pattern of the first organic insulating layer IL4 of the peripheral area LA are formed by using a mask (S60). The pattern of the first organic insulating layer IL4 of the peripheral area LA includes a 2-1-th sub-dam D2-$a$, and the pattern of the first organic insulating layer IL4 may not be formed in the other peripheral area LA.

A material for a second data conductive layer is formed on the first organic insulating layer IL4, and is etched by using a mask to complete the second data conductive layer SD2 including a connecting member CE (S70).

A second organic insulating layer IL5 is formed on the first organic insulating layer IL4 and the second data conductive layer SD2, and an opening of the display area DA and a pattern of the second organic insulating layer IL5 of the peripheral area LA are formed by using a mask (S80). The pattern of the second organic insulating layer IL5 of the peripheral area LA includes a 1-1-th sub-dam D1-$a$ and a 2-2-th sub-dam D2-$b$, and a pattern of the second organic insulating layer IL5 may not be formed in the other peripheral area LA.

A material for a pixel electrode layer is stacked on the second organic insulating layer IL5, and is etched by using a mask to complete the pixel electrode layer PXL including a first electrode E1 (S90).

The materials for forming a pixel defining layer IL6 and a spacer IL7 are sequentially stacked on the second organic insulating layer IL5 and the pixel electrode layer PXL, and the pixel defining layer IL6 of the peripheral area LA and the pattern of the spacer IL7 are formed in the display area DA together with the opening overlapping at least part of the first electrode E1 and defining a light emitting region by using a half-tone mask (HPDL; S100). The pixel defining layer IL6 and the pattern of the spacer IL7 include a 1-2-th sub-dam D1-$b$, a 1-3-th sub-dam D1-$c$, a 2-3-th sub-dam D2-$c$, and a 2-4-th sub-dam D2-*d*, and the pixel defining layer IL6 and the pattern of the spacer IL7 may not be formed in the other peripheral area LA.

An intermediate layer (EL; FL+EML) and a second electrode E2 are sequentially stacked on the pixel defining layer IL6 and the spacer IL7. As a result, the functional layer FL and the second electrode E2 are electrically connected to each other in the peripheral area LA, and as shown in FIGS. 11A and 11B, the functional layer FL and the second electrode E2 are disconnected from each other in the first open region R1, the second open region R2, and the third open region R3 by the irradiating of laser beams (S120).

In an embodiment described with reference to FIG. 19, a layered structure of the display area DA has a difference, and the structure at the bottom of the third insulating layer IL3 has a difference, so the structure at the top of the third insulating layer IL3 may be substantially equivalent to those shown in FIGS. 10A to 10D and 11A and 11B.

For example, in case that the pattern of the first data conductive layer SD1 is formed as shown in FIG. 10A, the third insulating layer IL3 is partly etched, and its thickness is reduced by the value of gd1. The value of gd1 in this instance may be about 50 nm to about 90 nm. The third insulating layer IL3 exposed in the subsequent process (S70-2) for etching a material for a second data conductive layer is additionally partly further etched, and its thickness is reduced by the value of gd2. The value of gd2 may be about 100 nm to about 180 nm.

Referring to FIG. 10D, the thickness of the third insulating layer IL3 exposed in case that the sacrificial layer SFL is completed may be equivalent to the case of FIG. 10C, and the final thickness of the third insulating layer IL3 may have a value that is the thickness of the third insulating layer IL3 minus the thickness of about 180 nm. The thickness of the 3-2-th inorganic insulating layer IL3-2 remaining in the first peripheral area LA1 is reduced by about 100 nm to about 180 nm, and it may have the thickness of about 20 nm to about 100 nm.

As shown in FIGS. 11A and 11B, in case that the open regions R1, R2, and R3 are formed by irradiation of laser beams, the open regions R1, R2, and R3 are formed to be lower than the adjacent first peripheral area LA1 by the thickness of the 3-2-th inorganic insulating layer IL3-2, the functional layer FL, and the second electrode E2. The thickness difference gd3 between the open regions R1, R2, and R3 and the adjacent first peripheral area LA1 may be about 300 nm to about 500 nm.

A laser or drilling process may be further performed so as to form an opening area DTA penetrating through the display panel.

A cross-sectional structure of the open regions R1, R2, and R3 formed in case that the sacrificial layer is removed will now be described with reference to FIG. 20.

Figure 20:
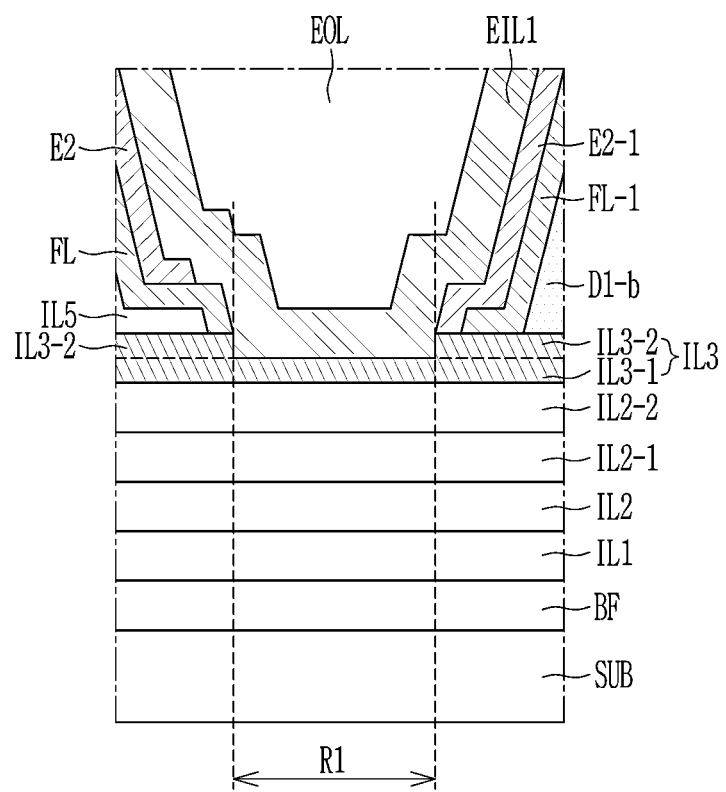
FIG. 20 illustrates a schematic enlarged cross-sectional view of a portion from which a sacrificial layer is removed on a display panel according to another embodiment.

FIG. 20 illustrates a schematic enlarged cross-sectional view of a region in which a sacrificial layer is removed in a display panel according to another embodiment.

FIG. 20 is similar to FIG. 8, and there is a difference that two additional insulating layers (a 2-1-th inorganic insulating layer IL2-1 and a 2-2-th inorganic insulating layer IL2-2) are positioned between the second insulating layer IL2 and the third insulating layer IL3.

Referring to FIG. 20, the functional layer FL and the second electrode E2 are separated from the 1-1-th layer FL-1 and the 2-1-th layer E2-1 with respect to the open regions R1, R2, and R3. The first encapsulation inorganic layer EIL1 positioned on the second electrode E2 is continuously formed on respective sides of the first open region R1.

A cross-sectional structure of a pixel PX with a structure shown in FIG. 18 in the display area will now be described with reference to FIG. 21.

Figure 21:
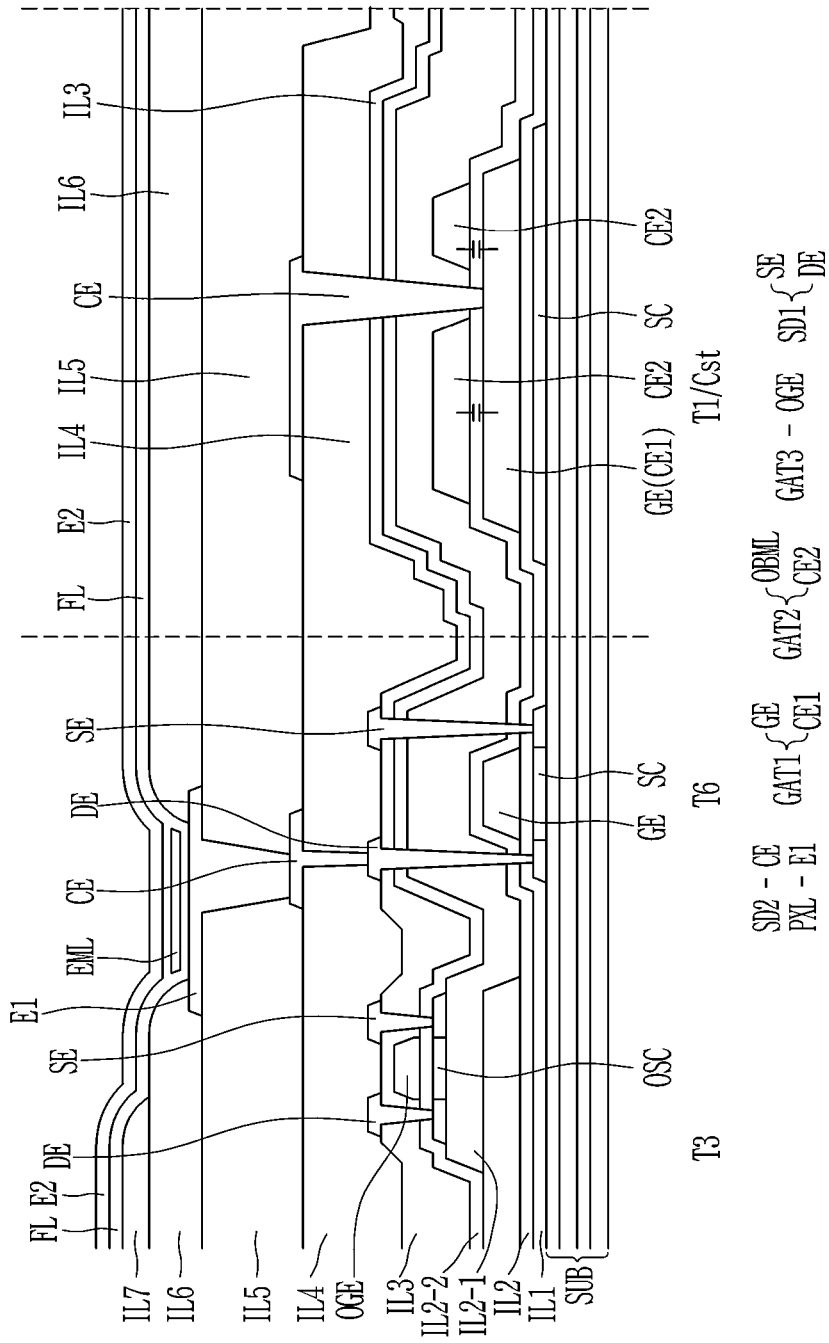
FIG. 21 illustrates a schematic cross-sectional view of a pixel included in a display area on a display panel according to an embodiment of FIG. 18.

FIG. 21 illustrates a schematic cross-sectional view of a pixel included in a display area on a display panel according to an embodiment of FIG. 18.

The substrate SUB may have various degrees of flexibility. The substrate SUB is made of insulating layers, and it may be a flexible substrate that is bent, folded, or rolled.

A buffer layer BF may be positioned on the substrate SUB, and it may be excluded a like way of the embodiment described with reference to FIG. 21.

A semiconductor layer SC is positioned on the substrate SUB. The semiconductor layer SC may include polysilicon. The semiconductor layer SC includes a channel region overlapping the gate electrode GE positioned at the top portion, and a first region and a second region positioned on respective sides thereof. The channel region represents a semiconductor region which is doped with a small amount of impurities compared to the first region and the second region, or which is dopoed with no impurities, and the first region and the second region represent semiconductor regions which are doped with a large amount of impurities compared to the channel region.

A first insulating layer IL1 is positioned on the semiconductor layer SC. The first insulating layer IL1 may have a single-layer or multi-layered structure including at least one of a silicon oxide ($SiO_x$), a silicon nitride ($SiN_x$), and a silicon oxynitride ($SiO_xN_y$).

A first gate conductive layer GAT1 including a gate electrode GE and a first capacitor electrode CE1 is positioned on the first insulating layer IL1. The first gate conductive layer GAT1 may be a single layer or a multi-layer in which a metal layer including one of copper (Cu), a copper alloy, aluminum (Al), an aluminum alloy, molybdenum (Mo), a molybdenum alloy, titanium (Ti), and a titanium alloy is stacked. The gate electrode GE may overlap the channel region of the semiconductor layer SC in a plan view.

A second insulating layer IL2 is positioned on the first gate conductive layer GAT1 and the first insulating layer IL1. The second insulating layer IL2 may be a single layer or a multi-layer including at least one of a silicon oxide ($SiO_x$), a silicon nitride ($SiN_x$), and a silicon oxynitride ($SiO_xN_y$).

A second gate conductive layer GAT2 including a second capacitor electrode CE2 and an overlapping electrode OBML is positioned on the second insulating layer IL2. The second capacitor electrode CE2 and the overlapping electrode OBML may be different portions of a conductive pattern. The second capacitor electrode CE2 overlaps the first capacitor electrode CE1 to form a storage capacitor Cst. The overlapping electrode OBML overlaps a channel of an oxide semiconductor layer OSC to be described below. The second gate conductive layer GAT2 may be a single layer or a multi-layer in which a metal layer including one of copper (Cu), a copper alloy, aluminum (Al), an aluminum alloy, molybdenum (Mo), a molybdenum alloy, titanium (Ti), and a titanium alloy is stacked.

A 2-1-th inorganic insulating layer IL2-1 is positioned on the second gate conductive layer GAT2 and the second insulating layer IL2. The 2-1-th inorganic insulating layer IL2-1 may be a single layer or a multi-layer including at least one of a silicon oxide ($SiO_x$), a silicon nitride ($SiN_x$), and a silicon oxynitride ($SiO_xN_y$).

An oxide semiconductor layer OSC is positioned on the 2-1-th inorganic insulating layer IL2-1. The oxide semiconductor layer OSC includes a channel region overlapping the gate electrode GE positioned at the top portion, and a first region and a second region positioned on respective sides of the channel region. The channel region represents a semiconductor region which is doped with a small amount of impurities compared to the first region and the second region, or which is doped with no impurities, and the first region and the second region represent semiconductor regions which are doped with a large amount of impurities compared to the channel region.

A 2-2-th inorganic insulating layer IL2-2 is formed on the 2-1-th inorganic insulating layer IL2-1 and the oxide semiconductor layer OSC. The 2-2-th inorganic insulating layer IL2-2 may be a single layer or a multi-layer including at least one of a silicon oxide ($SiO_x$), a silicon nitride ($SiN_x$), and a silicon oxynitride ($SiO_xN_y$).

A third gate conductive layer GAT3 including an oxide gate electrode OGE is positioned on the 2-2-th inorganic insulating layer IL2-2. The oxide gate electrode OGE overlaps the channel of the oxide semiconductor layer OSC. The third gate conductive layer GAT3 may be a single layer or a multi-layer in which a metal layer including one of copper (Cu), a copper alloy, aluminum (Al), an aluminum alloy, molybdenum (Mo), a molybdenum alloy, titanium (Ti), and a titanium alloy is stacked.

A third insulating layer IL3 is positioned on the 2-2-th inorganic insulating layer IL2-2 and the third gate conductive layer GAT3. The third insulating layer IL3 may be a single layer or a multi-layer including at least one of a silicon oxide ($SiO_x$), a silicon nitride ($SiN_x$), and a silicon oxynitride ($SiO_xN_y$).

A first data conductive layer SD1 including a source electrode SE and a drain electrode DE is positioned on the third insulating layer IL3. The source electrode SE and the drain electrode DE may be electrically connected to the first region S and the second region D of the semiconductor layer SC through contact holes formed in the third insulating layer IL3 and the first and second inorganic insulating layers IL1 and IL2. Depending on embodiments, the semiconductor layer SC may directly extend to be electrically connected to the adjacent pixel without the source electrode SE and the drain electrode DE. The first data conductive layer SD1 may include aluminum (Al), silver (Ag), magnesium (Mg), chromium (Cr), nickel (Ni), calcium (Ca), molybdenum (Mo), titanium (Ti), tungsten (W), and/or copper (Cu), and it may have a single-layer or multi-layer structure including the same. The first data conductive layer SD1 has a triple-layer structure in which aluminum (Al) is disposed between two layers of titanium (Ti), and it will be mainly described with the focus on the triple-layer structure of Ti/Al/Ti.

A first organic insulating layer IL4 and a second organic insulating layer IL5 are sequentially positioned on the third insulating layer IL3 and the first data conductive layer SD1. The first organic insulating layer IL4 and the second organic insulating layer IL5 may include a general polymer such as polymethylmethacrylate (PMMA) or polystyrene (PS), a polymer derivative having a phenol-based group, and an organic insulating material such as an acryl-based polymer, an imide-based polymer, a polyimide, and a siloxane-based polymer.

A connecting member CE may be positioned between the first organic insulating layer IL4 and the second organic insulating layer IL5. The connecting member CE configures a second data conductive layer SD2, and it may electrically connect the drain electrode DE to the first electrode E1 or may electrically connect the first capacitor electrode CE1 or the gate electrode of the driving transistor T1 to another constituent element. The second data conductive layer SD2 may include aluminum (Al), silver (Ag), magnesium (Mg), gold (Au), nickel (Ni), chromium (Cr), calcium (Ca), molybdenum (Mo), titanium (Ti), tungsten (W), and/or copper (Cu), and it may have a single-layer or multi-layer structure including the same. The second data conductive layer SD2 has a triple-layer structure in which aluminum (Al) is disposed between two layers of titanium (Ti) in a like way of the first data conductive layer SD1, and it will be mainly described with the focus on the triple-layer structure of Ti/Al/Ti.

A first electrode E1 is positioned on the second organic insulating layer IL5. The first electrode E1 configures a pixel electrode layer PXL and is electrically connected to the connecting member CE through a contact hole of the second organic insulating layer IL5. The first electrode E1 is electrically connected to the drain electrode DE. The first electrode E1 may include a metal such as silver (Ag), lithium (Li), calcium (Ca), aluminum (Al), magnesium (Mg), and gold (Au) and may include a transparent conductive oxide (TCO) such as an indium tin oxide (ITO) and an indium zinc oxide (IZO). The first electrode E1 may be made of a single layer including a metal material or a transparent conductive oxide, or a multi-layer including them. The first electrode E1 may have a triple-layer structure including indium tin oxide (ITO)/silver (Ag)/indium tin oxide (ITO), and it will be described with the focus on the structure of ITO/Ag/ITO.

The gate electrode GE and the semiconductor layer SC configure a polycrystalline transistor, and the oxide gate electrode OGE and the oxide semiconductor layer OSC configure an oxide transistor. They may include a source electrode SE and a drain electrode DE electrically connected to a first region and a second region of the semiconductor layer (SC and OSC) depending on transistors. Depending on transistors, the transistor may be configured with the gate electrode GE and the semiconductor layers (SC and OSC) without using the source electrode SE and the drain electrode DE. The transistor (the sixth transistor T6) is electrically connected to the first electrode E1 and supplies a current to the light-emitting device LED.

A pixel defining layer IL6 and a spacer IL7 are positioned on the second organic insulating layer IL5 and the first electrode E1.

The pixel defining layer IL6 overlaps at least part of the first electrode E1 and has an opening for defining a light emitting region. The opening may have a planar shape that is substantially similar to that of the first electrode E1. The opening may have a rhombic shape in a plan view or an octagonal shape that is similar to the rhombic shape, but the disclosure is not limited thereto, it may have various shapes such as a quadrangle, a polygon, a circle, and an oval.

The pixel defining layer IL6 and the spacer IL7 may include a general polymer such as polymethylmethacrylate (PMMA) or polystyrene (PS), a polymer derivative having a phenol-based group, and an organic insulating material such as an acryl-based polymer, an imide-based polymer, a polyimide, an acryl-based polymer, and a siloxane-based polymer.

An intermediate layer EL is positioned on the pixel defining layer IL6, the spacer IL7, and the first electrode E1. Referring to FIG. 6, the intermediate layer EL may include an emission layer EML and a functional layer FL. The emission layer EML of the intermediate layer EL may generate a predetermined color light. The emission layer EML may include an organic material and/or an inorganic material. The emission layer EML is formed in the opening of the pixel defining layer IL6. The functional layer FL may include at least one of a hole injection layer (HIL), a hole transporting layer (HTL), an electron transporting layer (ETL), and an electron injection layer (EIL). The functional layer FL may be divided into a first functional layer FL1 positioned between the first electrode E1 and the emission layer EML and a second functional layer FL2 positioned between the emission layer EML and the second electrode E2. The functional layer FL may overlap the front side of the substrate SUB. The functional layer FL may be disposed on and across pixels.

A second electrode E2 is positioned on the intermediate layer EL. The second electrode E2 may include a reflective metal including calcium (Ca), barium (Ba), magnesium (Mg), aluminum (Al), silver (Ag), platinum (Pt), palladium (Pd), gold (Au), nickel (Ni), neodymium (Nd), iridium (Ir), chromium (Cr), and lithium (Li), or a transparent conductive oxide (TCO) such as an indium tin oxide (ITO) and an indium zinc oxide (IZO).

The first electrode E1, the intermediate layer EL, and the second electrode E2 may configure a light-emitting device LED. Here, the first electrode E1 may be an anode that is a hole injection electrode, and the second electrode E2 may be a cathode that is an electron injection electrode. However, the embodiment is not limited thereto, and the first electrode E1 may be a cathode, and the second electrode E2 may be an anode, depending on methods for driving an emissive display device.

Holes and electrons are injected into the emission layer EL from the first electrode E1 and the second electrode E2, and light emits in case that excitons that are a combination of the injected holes and electrons fall to the ground state from the excited state.

Although not shown in FIG. 21, an encapsulation layer ENC is positioned on the second electrode E2 in a like way of FIGS. 6 and 7. The encapsulation layer ENC may cover (or overlap) an upper side of the light-emitting device LED and a lateral side thereof to seal the same. The light-emitting device LED is vulnerable to moisture and oxygen, so the encapsulation layer ENC seals the light-emitting device LED to block an inflow of external moisture and oxygen. The encapsulation layer ENC may include layers, it may be made of (or include) complex layers including an inorganic layer and an organic layer, and for example, it may be formed to be triple layers configured by sequentially stacking a first encapsulation inorganic layer EIL1, an encapsulation organic layer EOL, and a second encapsulation inorganic layer EIL2.

The embodiment having the pixel structure shown in FIGS. 5 and 6 and the embodiment having the pixel structure shown in FIGS. 18 and 21 have been described above. The disclosure is applicable to various other embodiments.

A modified embodiment of FIG. 7 will now be described with reference to FIG. 22.

Figure 22:
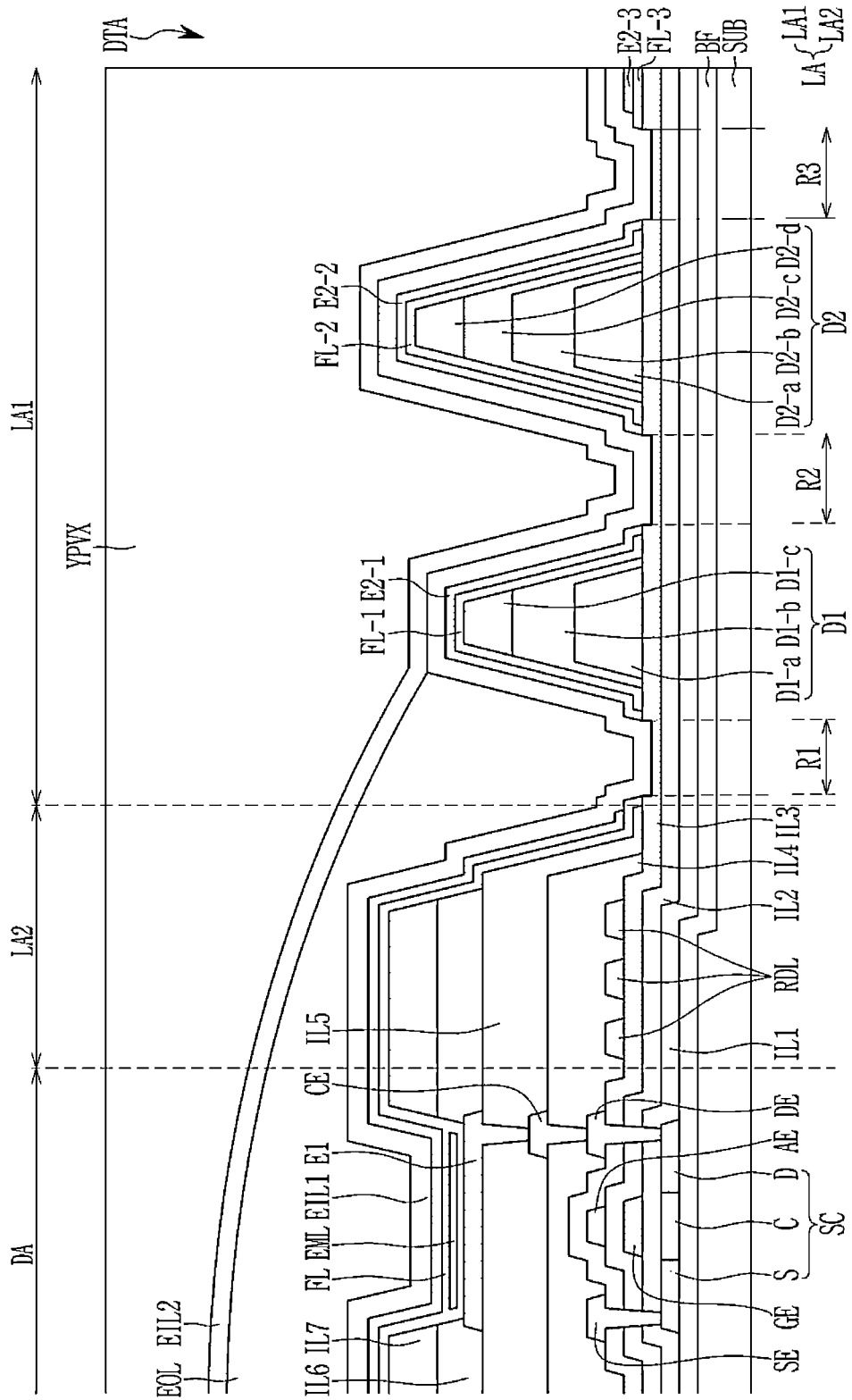
FIG. 22 illustrates a schematic cross-sectional view of a display panel on which a peripheral area and an opening area are positioned according to another embodiment.

FIG. 22 illustrates a schematic cross-sectional view of a display panel on which a peripheral area and an opening area are positioned according to another embodiment.

Referring to FIG. 22, unlike FIG. 7, an additional planarization layer YPVX is formed as an additional insulating layer.

For example, the additional insulating layer for covering (or overlapping) the peripheral area LA and the display area DA is formed with the additional planarization layer YPVX so that it may have a planar characteristic. Depending on embodiments, a touch electrode for sensing a touch may be additionally formed between the encapsulation layer ENC and the additional planarization layer YPVX in the display area DA.

In an embodiment described with reference to FIG. 22, an internal side of the opening area DTA may be defined by ends of the substrate SUB, the buffer layer BF, the first insulating layer IL1, the second insulating layer IL2, the third insulating layer IL3, the 1-3-th layer FL-3, the 2-1-th layer E2-1, the first encapsulation inorganic layer EIL1, the second encapsulation inorganic layer EIL2, and the additional planarization layer YPVX. The substrate SUB, the buffer layer BF, the first insulating layer IL1, the second insulating layer IL2, the third insulating layer IL3, the 1-3-th layer FL-3, the 2-1-th layer E2-1, the first encapsulation inorganic layer EIL1, the second encapsulation inorganic layer EIL2, and the additional planarization layer YPVX may be incised together, and the ends of the respective layers are aligned to each other.

However, the disclosure is not limited thereto, and some of the above-described constituent elements may be omitted or some may be added to configure the internal side of the opening area DTA.

While this disclosure has been described in connection with what is presently considered to be practical embodiments, it is to be understood that the disclosure is not limited to the disclosed embodiments, but, on the contrary, is intended to cover various modifications and equivalent arrangements included within the spirit and scope of the appended claims.

What is claimed is:
1. A display device comprising:
a substrate including:
an opening area;
a peripheral area adjacent to the opening area; and
a display area adjacent to the peripheral area;
a semiconductor layer overlapping the display area, disposed on the substrate, and including a channel;
a gate electrode overlapping the channel of the semiconductor layer;
an insulating layer disposed on the gate electrode, and including:
a first inorganic insulating layer; and
a second inorganic insulating layer disposed on the first inorganic insulating layer;
a first electrode disposed on the insulating layer;
an emission layer disposed on the first electrode; and
a second electrode disposed on the emission layer, wherein
the second inorganic insulating layer is not disposed in at least a portion of an open region in which the emission layer and the second electrode are disconnected in the peripheral area,
at least one of the emission layer and the second electrode are spaced apart from a center of the open region from a plan view perspective, the center being half-way between a first edge of the open region facing the opening area and second edge of the open region facing the display area, and
an end of the second inorganic insulating layer corresponds an end of the emission layer or an end of the second electrode in a cross-sectional view.

2. The display device of claim 1, wherein
the first inorganic insulating layer includes a silicon oxide, and
the second inorganic insulating layer includes a silicon nitride.

3. The display device of claim 2, wherein the first inorganic insulating layer is continuously disposed throughout the open region.

4. A display device comprising:
a substrate including:
an opening area;
a peripheral area adjacent to the opening area; and
a display area adjacent to the peripheral area:
a semiconductor layer overlapping the display area. disposed on the substrate, and including a channel;
a gate electrode overlapping the channel of the semiconductor layer:
an insulating layer disposed on the gate electrode, and including:
a first inorganic insulating layer; and
a second inorganic insulating layer disposed on the first inorganic insulating layer:
a first electrode disposed on the insulating layer:
an emission layer disposed on the first electrode; and
a second electrode disposed on the emission layer wherein
the second inorganic insulating layer is not disposed in at least a portion of an open region in which the emission layer and the second electrode are disconnected in the peripheral area,
at least one of the emission layer and the second electrode are spaced apart from a center of the open region from a plan view perspective, the center being half-way between a first edge of the open region facing the opening area and second edge of the open region facing the display area,
the peripheral area includes:
a first peripheral area including the open region; and
a second peripheral area including a roundabout portion, and
a data line is disposed on the insulating layer and detours around the roundabout portion.

5. The display device of claim 4, wherein
the opening area that penetrates through a the display panel is disposed in the first peripheral area, and
the display device further includes a camera disposed in the opening area.

6. The display device of claim 4, wherein
the first peripheral area includes dams, each of the dams closest to the open region being spaced apart from the open region as seen from a plan view perspective, and each dam of the dams has a ring shape.

7. The display device of claim 6, wherein the open region is disposed on sides of at least one dam of the plurality of dams.

8. A display device comprising:
a substrate including:
an opening area;
a peripheral area adjacent to the opening area; and
a display area adjacent to the peripheral area;
a semiconductor layer overlapping the display area, disposed on the substrate, and including a channel;
a gate electrode overlapping the channel of the semiconductor layer;
an insulating layer disposed on the gate electrode, and including:
a first inorganic insulating layer; and
a second inorganic insulating layer disposed on the first inorganic insulating layer;
a first electrode disposed on the insulating layer;
an emission layer disposed on the first electrode; and
a second electrode disposed on the emission layer, wherein
the second inorganic insulating layer is not disposed in at least a portion of an open region in which the emission layer and the second electrode are disconnected in the peripheral area, and
a distance from a topmost surface of the insulating layer facing away from the substrate in the open region and a top surface of the second electrode facing away from the substrate in the peripheral area at an edge of the open region perpendicular to the topmost surface of the insulating layer is 300 nm to 500 nm, and
the peripheral area includes:
a first peripheral area including the open region; and
a second peripheral area including a roundabout portion, and
a data line is disposed on the insulating layer and detours around the roundabout portion.

9. The display device of claim 8, wherein
the first inorganic insulating layer includes a silicon oxide, and
the second inorganic insulating layer includes a silicon nitride.

10. The display device of claim 9, wherein the first inorganic insulating layer is continuously disposed throughout the open region.

11. The display device of claim 10, wherein a thickness of the second inorganic insulating layer is 20 nm to 100 nm.

12. The display device of claim 11, wherein
the opening area penetrating through a the display panel is disposed in the peripheral area, and
the display device further includes a camera disposed in the opening area.

13. The display device of claim 8, wherein
the first peripheral area includes at least one dam spaced apart from the open region as seen from a plan view perspective,
the dam has a ring shape, and
the open region is disposed on sides of the at least one dam.

14. The display device of claim 8, wherein at least one of the emission layer and the second electrode are spaced apart from a center of the open region from a plan view perspective, the center being half-way between a first edge of the open region facing the opening area and second edge of the open region facing the display area.

* * * * *